(12) United States Patent
Tatsuoka et al.

(10) Patent No.: US 10,710,168 B2
(45) Date of Patent: Jul. 14, 2020

(54) SURFACE-COATED CUTTING TOOL IN WHICH HARD COATING LAYER EXHIBITS EXCELLENT CHIPPING RESISTANCE

(71) Applicant: MITSUBISHI MATERIALS CORPORATION, Tokyo (JP)

(72) Inventors: Sho Tatsuoka, Naka (JP); Kenichi Sato, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 156 days.

(21) Appl. No.: 15/755,443

(22) PCT Filed: Aug. 31, 2016

(86) PCT No.: PCT/JP2016/075390
§ 371 (c)(1),
(2) Date: Apr. 10, 2018

(87) PCT Pub. No.: WO2017/038840
PCT Pub. Date: Mar. 9, 2017

(65) Prior Publication Data
US 2018/0257147 A1 Sep. 13, 2018

(30) Foreign Application Priority Data

Aug. 31, 2015 (JP) .................................. 2015-170657
Aug. 25, 2016 (JP) .................................. 2016-165183

(51) Int. Cl.
*B23B 27/14* (2006.01)
*C23C 16/34* (2006.01)
(Continued)

(52) U.S. Cl.
CPC ............ *B23B 27/148* (2013.01); *C23C 16/34* (2013.01); *C23C 16/36* (2013.01);
(Continued)

(58) Field of Classification Search
USPC .......... 51/307, 309; 428/216, 336, 697, 698, 428/699, 701, 702
See application file for complete search history.

(56) References Cited

U.S. PATENT DOCUMENTS

| 2010/0323176 A1 | 12/2010 | Van Den Berg et al. |
| 2011/0003126 A1 | 1/2011 | Van Den Berg et al. |

(Continued)

FOREIGN PATENT DOCUMENTS

| CN | 104070194 A | 10/2014 |
| CN | 104755201 A | 7/2015 |

(Continued)

OTHER PUBLICATIONS

Office Action dated Oct. 15, 2018 for the corresponding Chinese Patent Application No. 201680049627.3.
(Continued)

*Primary Examiner* — Archene A Turner
(74) *Attorney, Agent, or Firm* — Leason Ellis LLP

(57) ABSTRACT

The hard coating layer of the cutting tool includes a complex nitride or complex carbonitride layer expressed by the composition formula: $(Ti_{1-x}Al_x)(C_yN_{1-y})$. $x_{avg}$ and $y_{avg}$ satisfy $0.60 \leq x_{avg} \leq 0.95$ and $0 \leq y_{avg} \leq 0.005$. $x_{avg}$ is an average content ratio of Al in a total amount of Ti and Al, and $y_{avg}$ is an average content ratio of C in a total amount of C and N. Some crystal grains composing the complex nitride or complex carbonitride layer have a cubic structure. In crystal grains having the cubic structure, the average crystal grain misorientaion is 1 degree or more; or 2 degrees or more, based on analysis of the polished surface perpendicular to a surface of the layer. A peak exists in 1-2 degrees of the average crystal grain misorientation in the frequency distribution of the average crystal grain misorientation and the area ratio.

5 Claims, 4 Drawing Sheets

(51) Int. Cl.
    *C23C 16/36* (2006.01)
    *C23C 28/04* (2006.01)
    *C23C 16/455* (2006.01)
    *C23C 28/00* (2006.01)

(52) U.S. Cl.
    CPC ........ *C23C 16/45523* (2013.01); *C23C 28/00* (2013.01); *C23C 28/042* (2013.01); *C23C 28/044* (2013.01)

(56) References Cited

U.S. PATENT DOCUMENTS

| | | | |
|---|---|---|---|
| 2017/0165758 A1* | 6/2017 | Tatsuoka | B23C 5/16 |
| 2017/0198400 A1* | 7/2017 | Tatsuoka | B23B 27/14 |

FOREIGN PATENT DOCUMENTS

| | | |
|---|---|---|
| CN | 104801941 A | 7/2015 |
| CN | 104816526 A | 8/2015 |
| EP | 3135412 A1 | 3/2017 |
| EP | 3150310 A1 | 4/2017 |
| JP | 2011-513594 A | 4/2011 |
| JP | 2011-516722 A | 5/2011 |
| JP | 2011-189473 A | 9/2011 |
| JP | 2012-020391 A | 2/2012 |
| JP | 2013-248675 A | 12/2013 |
| JP | 2014-024130 * | 2/2014 |
| JP | 2014-024131 A | 2/2014 |
| WO | WO-2015/163391 A | 10/2015 |
| WO | WO-2015/182711 A | 12/2015 |

OTHER PUBLICATIONS

European Search Report dated Mar. 6, 2019 for the corresponding European Patent Application No. 16841870.5.

Hidehiko Kimura et al., "Misorientation Analysis of Plastic Deformation of Austenitic Stainless Steel by EBSD and X-Ray Diffraction Methods", *the Japan Society of Mechanical Engineers(Series A)*, 2005-12, pp. 1722 to 1728, vol. 71, No. 712, No. 05-0367.

International Search Report dated Nov. 22, 2016 for the corresponding PCT Application No. PCT/JP2016/075390.

* cited by examiner

MEASUREMENT POINT (1)   GRAIN BOUNDARY (2)
(PIXEL)

SURFACE-COATED CUTTING TOOL IN WHICH HARD COATING LAYER EXHIBITS EXCELLENT CHIPPING RESISTANCE

CROSS-REFERENCE TO RELATED PATENT APPLICATIONS

This application is a U.S. National Phase Application under 35 U.S.C. § 371 of International Patent Application No. PCT/JP2016/075390 filed on Aug. 31, 2016 and claims the benefit of Japanese Patent Applications No. 2015-170657, filed on Aug. 31, 2015 and No. 2016-165183, filed on Aug. 25, 2016, all of which are incorporated herein by reference in their entireties. The International Application was published in Japanese on Mar. 9, 2017 as International Publication No. WO/2017/038840 under PCT Article 21(2).

FIELD OF THE INVENTION

The present invention relates to a surface-coated cutting tool (hereinafter, referred to as coated tool), in which a hard coating layer exhibits excellent chipping resistance during high-speed intermittent cutting of alloy steel or the like during which high-temperature heat is generated and impact loads are exerted on a cutting edge, and excellent cutting performance is exhibited during long-term use.

BACKGROUND OF THE INVENTION

Hitherto, in general, coated tools in which the surfaces of tool bodies made of tungsten carbide (hereinafter, referred to as WC)-based cemented carbide, titanium carbonitride (hereinafter, referred to as TiCN)-based cermet, or a cubic boron nitride (hereinafter, referred to as cBN)-based ultra-high pressure sintered material (hereinafter, collectively referred to as a tool body) are covered with a Ti—Al-based layer of complex nitride as a hard coating layer through a physical vapor deposition method are known, and it is known that these coated tools exhibit excellent wear resistance.

However, although the coated tool coated with the Ti—Al-based layer of complex nitride in the related art has relatively excellent wear resistance, in a case of using the coated tool under high-speed intermittent cutting conditions, abnormal wear such as chipping easily occurs. Therefore, various suggestions for an improvement in the hard coating layer have been made.

For example, Japanese Patent Application Publication No. 2012-20391 discloses that excellent wear resistance and fracture resistance are obtained, by a surface-coated cutting tool, in which a hard coating layer is formed on a surface of a tool body, the hard coating layer is configured with one layer or multiple layers, in a case where a thickness of a thinnest portion of the hard coating layer is set as T1 and a thickness at a point separated from a cutting edge ridge line by 1 mm in a cutting face direction is set as T2 in a section obtained by cutting at a specific plane, T1<T2 is satisfied, in a case where a point separated by a distance Da from the cutting edge ridge line in the rake face direction is set as a and a point separated by a distance Db in a flank direction is set as b on a surface of the hard coating layer, Da and Db satisfy a specific numerical value range, and deviation of a crystal orientation of crystal grains configuring the hard coating layer is equal to or more than 5 degrees and less than 10 degrees, in a region of the hard coating layer from the point a to the point b which is equal to or more than 10% of a region E occupying thicknesses 0.1 Ti to 0.9 Ti from the surface.

Japanese Patent Application Publication No. 2011-516722 describes that by performing chemical vapor deposition in a mixed reaction gas of $TiCl_4$, $AlCl_3$, and $NH_3$ in a temperature range of 650° C. to 900° C., a $(Ti_{1-x}Al_x)N$ layer in which the value of the amount x of Al is 0.65 to 0.95 can be deposited. However, this literature is aimed at further coating the $(Ti_{1-x}Al_x)N$ layer with an $Al_2O_3$ layer and thus improving a heat insulation effect. Therefore, the effects of the formation of the $(Ti_{1-x}Al_x)N$ layer in which the value of the amount x of Al is increased to 0.65 to 0.95 on cutting performance are not clear.

In addition, for example, Japanese Patent Application Publication No. 2011-513594 suggests that the heat resistance and fatigue strength of a coated tool are improved by coating a TiCN layer and an $Al_2O_3$ layer as inner layers with a $(Ti_{1-x}Al_x)N$ layer (x is 0.65 to 0.90 in terms of atomic ratio) having a cubic structure or a cubic structure including a hexagonal structure as an outer layer, and applying a compressive stress of 100 to 1100 MPa to the outer layer.

Technical Problem

There has been a strong demand for power saving and energy saving during cutting in recent years. In accordance with this, there is a trend toward a further increase in speed and efficiency during cutting. Therefore, abnormal damage resistance such as chipping resistance, fracture resistance, and peeling resistance is further required for a coated tool, and excellent wear resistance is required during long-term use.

However, in a coated tool described in Japanese Patent Application Publication No. 2012-20391, although improvement of properties of the coated tool realized by setting the deviation of the crystal orientation of crystal grains in a predetermined range is disclosed, improvement of hardness and wear resistance by increasing an amount x of Al of the hard coating layer formed of a $(Ti_{1-x}Al_x)N$ layer is not concerned. In addition, effects due to misorientation in crystal grains are not disclosed, either. Therefore, in a case where the coated tool is provided for high-speed intermittent cutting of alloy steel or the like, it cannot be said that sufficient wear resistance and chipping resistance are obtained.

On the other hand, in the $(Ti_{1-x}Al_x)N$ layer deposited through the chemical vapor deposition method described in Japanese Patent Application Publication No. 2011-516722, the amount x of Al can be increased and a cubic structure can be formed. However, in a case where this is used as the hard coating layer of the coated tool, the adhesion strength thereof to a tool body is insufficient and the toughness thereof may be deteriorated.

Furthermore, in the coated tool described in Japanese Patent Application Publication No. 2011-513594, although the coated tool has a predetermined hardness and excellent wear resistance, the toughness thereof is deteriorated. Therefore, in a case where the coated tool is provided for high-speed intermittent cutting of alloy steel or the like, abnormal damage such as chipping, fracture, and peeling easily occurs and it cannot be said that satisfactory cutting performance is exhibited.

Here, an object of the present invention is to solve the aforementioned problems and to provide a coated tool which has excellent toughness and exhibits excellent chipping resistance and wear resistance during long-term use even in a case of being provided for high-speed intermittent cutting of alloy steel or the like.

SUMMARY OF THE INVENTION

Solution to Problem

The present inventors intensively studied to improve the chipping resistance and wear resistance of a coated tool in which a hard coating layer containing at least a layer of complex nitride or complex carbonitride of Ti and Al (hereinafter, sometimes referred to as "(Ti,Al)(C,N)" or "$(Ti_{1-x}Al_x)(C_yN_{1-y})$") is deposited by chemical vapor deposition. As a result, the following knowledge was obtained.

That is, in a case where a $(Ti_{1-x}Al_x)(C_yN_{1-y})$ layer is formed to have a columnar shape in a direction perpendicular to a tool body, the hard coating layer including a $(Ti_{1-x}Al_x)(C_yN_{1-y})$ layer and having a predetermined average layer thickness has high wear resistance, however toughness is not sufficient. As a result, it cannot be said that chipping resistance and fracture resistance are sufficiently satisfied.

Here, the present inventors have intensively studied about crystal orientation of crystal grains of the $(Ti_{1-x}Al_x)(C_yN_{1-y})$ layer configuring the hard coating layer, and have found new findings as follows. By causing the $(Ti_{1-x}Al_x)(C_yN_{1-y})$ layer to include crystal grains having a NaCl type face-centered cubic structure and causing crystal grains having an average crystal grain misorientation of each of the crystal grains having the NaCl type face-centered cubic structure which is 1 degree or greater to be present in the $(Ti_{1-x}Al_x)(C_yN_{1-y})$ layer at a predetermined area ratio, stress of $(Ti_{1-x}Al_x)(C_yN_{1-y})$ crystal grains having the NaCl type face-centered cubic structure in an in-plane direction parallel to a surface of the tool body is alleviated. Therefore, toughness can be increased, and as a result, chipping resistance and fracture resistance of the hard coating layer can be improved.

Specifically, the hard coating layer includes at least a layer of complex nitride or complex carbonitride of Ti and Al, in a case where the layer is expressed by a composition formula: $(Ti_{1-x}Al_x)(C_yN_{1-y})$, an average content ratio $x_{avg}$ of Al in the total amount of Ti and Al and an average content ratio $y_{avg}$ of C in the total amount of C and N (both $x_{avg}$ and $y_{avg}$ are atomic ratios) respectively satisfy $0.60 \leq x_{avg} \leq 0.95$ and $0 \leq y_{avg} \leq 0.005$, the layer of the complex nitride or the complex carbonitride includes crystal grains having a NaCl type face-centered cubic structure, in a case where crystal orientation of each of the crystal grains having the NaCl type face-centered cubic structure is analyzed by using an electron beam backward scattering diffraction device in a direction perpendicular to the surface of the hard coating layer, and the average crystal grain misorientation of each crystal grain is obtained, and 50% or more crystal grains having average crystal grain misorientation equal to or more than 1 degree is present with respect to the layer of complex nitride of Ti and Al or complex carbonitride of Ti and Al in an area ratio, stress of the $(Ti_{1-x}Al_x)(C_yN_{1-y})$ crystal grains having the NaCl type face-centered cubic structure in the in-plane direction parallel to the surface of the tool body is alleviated, and it is possible to increase toughness, chipping resistance, and fracture resistance.

Preferably, in a case where 30% or more crystal grains having average crystal grain misorientation equal to or more than 2 degrees is present with respect to the layer of complex nitride of Ti and Al or complex carbonitride of Ti and Al in an area ratio, it is possible to further alleviate stress of $(Ti_{1-x}Al_x)(C_yN_{1-y})$ crystal grains having the NaCl type face-centered cubic structure in the in-plane direction parallel to the surface of the tool body.

In addition, in a case where a frequency peak of the area ratio is present in a range of the average crystal grain misorientation which is equal to or more than 1 degree and less than 2 degrees, it is possible to further more alleviate stress of $(Ti_{1-x}Al_x)(C_yN_{1-y})$ crystal grains having the NaCl type face-centered cubic structure in the in-plane direction parallel to the surface of the tool body.

The present inventors have found that, a coated tool in which the $(Ti_{1-x}Al_x)(C_yN_{1-y})$ layer having the average crystal grain misorientation is formed as the hard coating layer, exhibits excellent chipping resistance and fracture resistance, during high-speed intermittent cutting of alloy steel or the like during which high-temperature heat is generated and impact loads are exerted on a cutting edge, and excellent wear resistance is exhibited during long-term use.

The $(Ti_{1-x}Al_x)(C_yN_{1-y})$ layer having the average crystal grain misorientation described above can be formed by, for example, the following chemical vapor deposition method in which the composition of a reaction gas varies periodically on the surface of the tool body.

That is, in a chemical vapor deposition reaction apparatus, a gas group A of $NH_3$, $N_2$, and $H_2$ and a gas group B of $TiCl_4$, $AlCl_3$, $Al(CH_3)_3$, $N_2$, and $H_2$ are supplied into the reaction apparatus from separate gas supply tubes, the supplying of the gas group A and the gas group B into the reaction apparatus is performed so that, for example, the gases are allowed to flow at time intervals of a predetermined period only for a shorter time than the period, the supplying of the gases of the gas group A and the gas group B has a phase difference of a time shorter than the time for which the gases are supplied, and the composition of the reaction gas on the surface of the tool body can be changed over time between (i) the gas group A, (ii) a mixed gas of the gas group A and the gas group B, and (iii) the gas group B. Moreover, in the present invention, there is no need to introduce a long-term exhaust process intended for strict gas substitution. Therefore, as a gas supply method, for example, it is possible to realize the composition of the reaction gas on the surface of the tool body being able to be changed over time between (i) a mixed gas primarily containing the gas group A, (ii) a mixed gas of the gas group A and the gas group B, and (iii) a mixed gas primarily containing the gas group B by rotating gas supply ports, rotating the tool body, or reciprocating the tool body.

The $(Ti_{1-x}Al_x)(C_yN_{1-y})$ layer having a predetermined target layer thickness and predetermined average crystal grain misorientation can be formed on the surface of the tool body by performing a thermal CVD method for a predetermined time, for example, using, as the composition of the reaction gas (volume % with respect to the total amount of the gas group A and the gas group B), the gas group A of $NH_3$: 2.0% to 3.0%, $N_2$: 0% to 5%, and $H_2$: 45% to 50% and the gas group B of $AlCl_3$: 0.6% to 0.9%, $Al(CH_3)_3$: 0% to 0.5%, $TiCl_4$: 0.2% to 0.3%, $N_2$: 10.0% to 12.0%, and $H_2$: the balance, under a reaction atmosphere pressure of 4.0 to 5.0 kPa, at a reaction atmosphere temperature of 700° C. to 900° C., and with a supply period of 1 to 5 seconds, a gas supply time of 0.15 to 0.25 seconds per one period, and a phase difference between gas supply A and gas supply B of 0.10 to 0.20 seconds.

(1) The present invention is made based on the above-described knowledge and has the following aspects.

A surface-coated cutting tool including: a tool body composed of any one of a tungsten carbide-based cemented carbide, a titanium carbonitride-based cermet and a cubic boron nitride-based ultra-high pressure sintered material; and a hard coating layer provided on a surface of the tool body, wherein (a) the hard coating layer includes at least a layer of complex nitride or complex carbonitride of Ti and Al having an average thickness of 1-20 μm, and in a case where the layer of the complex nitride or the complex carbonitride is expressed by a composition formula: $(Ti_{1-x}Al_x)(C_yN_{1-y})$, $x_{avg}$ and $y_{avg}$ satisfy $0.60 \leq x_{avg} \leq 0.95$ and $0 \leq y_{avg} \leq 0.005$, respectively, where $x_{avg}$ is an average content ratio of Al in a total amount of Ti and Al in an atomic ratio, and $y_{avg}$ is an average content ratio of C in a total amount of C and N in an atomic ratio, (b) the layer of the complex nitride or the complex carbonitride includes at least crystal grains of a complex nitride or a complex carbonitride of Ti and Al having a NaCl type face-centered cubic structure, and (c) when a polished surface of the layer of the complex nitride or the complex carbonitride is analyzed from a direction perpendicular to the surface using an electron beam backward scattering diffraction device to obtain an average inner-grain misorientation of each of the crystal grains having the NaCl type face-centered cubic structure, an area ratio occupied by the crystal grains, which have the average crystal grain misorientaion of 1 degree or more and the NaCl type face-centered cubic structure, is 50% or more in the layer of the complex nitride or the complex carbonitride.

(2) The surface-coated cutting tool according to the above-described (1), wherein, when a polished surface of the layer of the complex nitride or the complex carbonitride is analyzed from a direction perpendicular to the surface using an electron beam backward scattering diffraction device to obtain an average inner-grain misorientation of each of the crystal grains having the NaCl type face-centered cubic structure, an area ratio occupied by the crystal grains, which have the average crystal grain misorientaion of 2 degrees or more and the NaCl type face-centered cubic structure, is 30% or more in the layer of the complex nitride or the complex carbonitride.

(3) The surface-coated cutting tool according to the above-described (1) or (2), wherein, when a polished surface of the layer of the complex nitride or the complex carbonitride is analyzed from a direction perpendicular to the surface using an electron beam backward scattering diffraction device to measure an average inner-grain misorientation of each of the crystal grains having the NaCl type face-centered cubic structure and to obtain a frequency distribution of the average crystal grain misorientation and the area ratio, a peak exists in a range of 1 degree or more and less than 2 degrees of the average crystal grain misorientation in the frequency distribution of the average crystal grain misorientation and the area ratio.

(4) The surface-coated cutting tool according to any one of the above-described (1) to (3), further including a lower layer between the tool body and the layer of the complex nitride or the complex carbonitride of Ti and Al, wherein the lower layer includes a Ti compound layer consisted of one or more of: a Ti carbide layer; Ti nitride layer; Ti carbonitride layer; Ti oxycarbide layer; and Ti oxicarbonitride layer, the Ti compound layer having an average total thickness of 0.1-20 μm.

(5) The surface-coated cutting tool according to any one of the above-described (1) to (4), further including an upper layer above the layer of the complex nitride or the complex carbonitride, wherein the upper layer includes at least an aluminum oxide layer, the upper layer having an average total thickness of 1-25 μm.

The "average crystal grain misorientation" means a grain orientation spread (GOS) value which will be described later.

The surface-coated cutting tool according to an aspect of the present invention (hereinafter, referred to as a "surface-coated cutting tool of the present invention") will be described below in detail.

Average Layer Thickness of Layer of a Complex Nitride or Complex Carbonitride of Ti and Al:

The hard coating layer included in the surface-coated cutting tool of the present invention includes at least the layer of complex nitride or complex carbonitride of Ti and Al, which is formed through chemical vapor deposition and is expressed by the composition formula: $(Ti_{1-x}Al_x)(C_yN_{1-y})$. The layer of complex nitride or complex carbonitride of Ti and Al has high hardness and excellent wear resistance, and the effect thereof is significantly exhibited particularly in a case where the average layer thickness thereof is 1 to 20 μm. The reason for this is that in a case where the average layer thickness thereof is less than 1 μm, the layer thickness thereof is too small to sufficiently ensure wear resistance during long-term use, and in a case where the average layer thickness thereof is more than 20 μm, the crystal grains of the layer of complex nitride or complex carbonitride of Ti and Al are likely to coarsen and chipping easily occurs. Therefore, the average layer thickness thereof is set to 1 to 20 μm.

Composition of Layer of a Complex Nitride or Complex Carbonitride of Ti and Al:

The layer of complex nitride or complex carbonitride of Ti and Al included in the hard coating layer included in the surface-coated cutting tool of the present invention is controlled such that an average content ratio $x_{avg}$ of Al in the total amount of Ti and Al and an average content ratio $y_{avg}$ of C in the total amount of C and N (both $x_{avg}$ and $y_{avg}$ are atomic ratios) satisfy $0.60 \leq x_{avg} \leq 0.95$ and $0 \leq y_{avg} \leq 0.005$, respectively.

The reason for this is that in a case where the average content ratio $x_{avg}$ of Al is less than 0.60, the hardness of the layer of complex nitride or complex carbonitride of Ti and Al deteriorates. Therefore, in a case where the layer is provided for high-speed intermittent cutting of alloy steel or the like, the wear resistance thereof is insufficient. On the other hand, in a case where the average content ratio $x_{avg}$ of Al is more than 0.95, the amount of Ti is relatively reduced, resulting in embrittlement and a reduction in chipping resistance. Therefore, the average content ratio $x_{avg}$ of Al is set to $0.60 \leq x_{avg} \leq 0.95$.

In a case where the average content ratio (atomic ratio) $y_{avg}$ of the component C included in the layer of complex nitride or complex carbonitride of Ti and Al is a small amount in a range of $0 \leq y_{avg} \leq 0.005$, adhesion between the layer of complex nitride or complex carbonitride of Ti and Al and the tool body or the lower layer is improved and lubricity thereof is improved. Thus, an impact during cutting is relieved, resulting in an improvement in the fracture resistance and chipping resistance of the layer of complex nitride or complex carbonitride of Ti and Al. On the other hand, in a case where the average content ratio $y_{avg}$ of the component C is beyond the range of $0 \leq y_{avg} \leq 0.005$, toughness of the layer of complex nitride or complex carbonitride of Ti and Al decreases. Accordingly, fracture resistance and chipping resistance in contrast, decrease, which is not preferable. Therefore, the average content ratio $y_{avg}$ of the component C is set to $0 \leq y_{avg} \leq 0.005$.

Average crystal grain misorientation (GOS value) of crystal grains having NaCl type face-centered cubic structure (hereinafter, also referred to as a "cubic") coposing the layer of complex nitride or complex carbonitride of Ti and Al:

The average crystal grain misorientation of cubic crystal grains of complex nitride of Ti and Al or complex carbonitride of Ti and Al is obtained by using an electron beam backward scattering diffraction device.

Specifically, in a case where polished surface as a surface in a direction perpendicular to the surface of the layer of complex nitride or complex carbonitride of Ti and Al is analyzed at an interval of 0.05 µm, and, as shown in FIG. 1 misorientation of equal to or more than 5 degrees is present between adjacent measurement points (hereinafter, also referred to as "pixels") (1), the point is defined as a boundary (2).

A region surrounded by the boundary (2) is defined as one crystal grain. Here, a pixel (1) individually present and having misorientation of equal to or more than 5 degrees with all of the adjacent pixels (1) is not defined as a crystal grain, and two or more pixels connected to each other are defined as a crystal grain.

The misorientation between the pixel (1) in the cubic crystal grain and all of the other pixels in the same crystal grain is calculated, this is obtained as the average crystal grain misorientation, and the averaged average crystal grain misorientation is defined as a grain orientation spread (GOS) value. FIG. 1 shows a schematic view. The GOS value is, for example, described in "Transactions of The Japan Society of Mechanical Engines (Series A) vol. 71, No. 712 (2005-12) Report No. 05-0367 pp. 1722-1728." The average crystal grain misorientation of the present invention means the GOS value. In a case where the GOS value is expressed by a numerical formula, the pixel number in the same crystal grain is set as n, the numbers for each of different pixels (1) in the same crystal grain are set as i and j (here, $1 \leq i, j \leq n$), and crystal misorientation acquired from crystal orientation in the pixel i and crystal orientation in the pixel j is set as $\alpha_{ij}$ ($i \neq j$), the GOS value can be expressed by Expression 1.

$$GOS = \frac{\sum_{i,j=1}^{n} \alpha_{ij(i \neq j)}}{n(n-1)} \quad \text{Expression 1}$$

The average crystal grain misorientation which is the GOS value can be referred to as an averaged numerical value of a value obtained by acquiring misorientation between the pixel (1) in the crystal grain and all of the other pixels in the same crystal grain, and this value becomes a high numerical value, in a case where a continuous orientation change is large in the crystal grain.

The average crystal grain misorientation (GOS value) can be acquired by performing measurement regarding the polished surface as a surface in a direction perpendicular to the surface of the layer of complex nitride or complex carbonitride of Ti and Al in a measurement range of 25×25 µm at an interval of 0.05 µm/step in 5 visual fields, acquiring the number of all pixels belonging to the cubic crystal grains composing the layer of complex nitride or complex carbonitride, dividing the average crystal grain misorientation at an interval of 1 degree, adding up the number of pixels (1) of the crystal grain having the average crystal grain misorientation in the range of this value, dividing the number thereof by the number of all pixels, and creating a frequency distribution (histogram) showing the area ratio of the average crystal grain misorientation.

For example, in a case where the average crystal grain misorientation regarding the cubic crystal grain of the layer of complex nitride or complex carbonitride of Ti and Al of the present invention is obtained and the frequency distribution (histogram) thereof is created, as shown in FIG. 2, it is found that the area ratio of the crystal grain having the average crystal grain misorientation equal to or more than 1 degree occupying the total area of the layer of complex nitride or complex carbonitride of Ti and Al is 50% or more.

As described above, the cubic crystal grains composing the layer of complex nitride or complex carbonitride of Ti and Al of the present invention have a great variation in crystal orientation in the crystal grain, compared to the crystal grains composing a TiAlN layer of the related art. Accordingly, stress in the in-plane direction parallel to the tool body is alleviated. Therefore, this contributes to improvement in toughness of the hard coating layer.

The coated tool in which the hard coating layer including at least the $(Ti_{1-x}Al_x)(C_yN_{1-y})$ layer having the average crystal grain misorientation is coated on the surface of the tool body, exhibits excellent chipping resistance and fracture resistance, during high-speed intermittent cutting of alloy steel or the like during which high-temperature heat is generated and impact loads are exerted on a cutting edge, and excellent wear resistance is exhibited during long-term use.

However, in a case where the area ratio of the crystal grains having the average crystal grain misorientation equal to or more than 1 degree occupying the total area of the layer of complex nitride or complex carbonitride of Ti and Al is less than 50%, the effect of stress alleviation in the in-plane direction parallel to the surface of the tool body of the crystal grain is not sufficient and the effect of toughness improvement of the hard coating layer is not sufficient. Therefore, the area ratio of the cubic crystal grains having the average crystal grain misorientation equal to or more than 1 degree occupying the total area of the layer of complex nitride or complex carbonitride of Ti and Al is set to 50% or more.

In the surface-coated tool of the present invention, it is desirable that the area ratio of the cubic crystal grain having the average crystal grain misorientation equal to or more than 2 degrees occupying the total area of the layer of complex nitride or complex carbonitride of Ti and Al is set to 30% or more, as shown in FIG. 3.

This is because the stress in the in-plane direction parallel to the surface of the tool body is more alleviated, toughness is improved, thereby improving chipping resistance and fracture resistance, due to the presence of the cubic crystal grain having the average crystal grain misorientation equal to or more than 2 degrees, and such effects are significantly exhibited, in a case where 30% or more cubic crystal grain having the average crystal grain misorientation equal to or more than 2 degrees is present at the area ratio.

In the surface-coated tool of the present invention, in a case where the average crystal grain misorientation of the cubic crystal grain of the layer of complex nitride or complex carbonitride of Ti and Al is measured and the frequency distribution of the average crystal grain misorientation and the area ratio thereof is obtained, as shown in FIG. 4, it is more desirable that a peak of the frequency distribution of the average crystal grain misorientation and the area ratio thereof is present in a range of the average crystal grain misorientation equal to or more than 1 degree and less than 2 degrees.

In such a case, stress in the in-plane direction parallel to the surface of the tool body is more alleviated. As a result, toughness is even more improved, and excellent chipping resistance and fracture resistance are exhibited during high-speed intermittent cutting of alloy steel or the like during which high-temperature heat is generated and impact loads are exerted on a cutting edge.

Lower Layer and Upper Layer:

The layer of complex nitride or complex carbonitride of Ti and Al included in the hard coating layer included in the surface-coated cutting tool of the present invention exhibits sufficient effects in itself. However, in a case where a lower layer which includes a Ti compound layer made of one layer or more layers of a Ti carbide layer, a Ti nitride layer, a Ti carbonitride layer, a Ti oxycarbide layer, and a Ti oxycarbonitride layer, and has an average total layer thickness of 0.1 to 20 μm is provided, or in a case where an upper layer including at least an aluminum oxide layer is formed to have an average total layer thickness of 1 to 25 μm, together with the effects of these layers, better characteristics can be exhibited.

In a case where the lower layer including a Ti compound layer made of one or more layers of a Ti carbide layer, a Ti nitride layer, a Ti carbonitride layer, a Ti oxycarbide layer, and a Ti oxycarbonitride layer, and has an average total layer thickness of 0.1 to 20 μm is provided, and the average total layer thickness of the lower layer is less than 0.1 μm, the effect of the lower layer is insufficiently exhibited. On the other hand, in a case where the average total layer thickness thereof is more than 20 μm, the crystal grains easily coarsen and chipping easily occurs. In addition, in a case where the average total layer thickness of the upper layer including an aluminum oxide layer is less than 1 μm, the effect of the upper layer is insufficiently exhibited. On the other hand, in a case where the average total layer thickness thereof is more than 25 μm, the crystal grains easily coarsen and chipping easily occurs.

Advantageous Effects of Invention

In the present invention, in the surface-coated cutting tool in which the hard coating layer is provided on the surface of the tool body, the hard coating layer includes at least the layer of complex nitride or complex carbonitride of Ti and Al having an average layer thickness of 1 to 20 μm, in a case where the layer is expressed by the composition formula: $(Ti_{1-x}Al_x)(C_yN_{1-y})$, an average content ratio $x_{avg}$ of Al in the total amount of Ti and Al and an average content ratio $y_{avg}$ of C in the total amount of C and N (both $x_{avg}$ and $y_{avg}$ are atomic ratios) respectively satisfy $0.60 \leq x_{avg} \leq 0.95$ and $0 \leq y_{avg} \leq 0.005$, the cubic crystal grains are present in the layer of complex nitride or complex carbonitride of Ti and Al, when a polished surface of the layer of the nitride or the carbonitride is analyzed from a direction perpendicular to the surface using an electron beam backward scattering fiffraction device to measure an average inner-grain misorientation of each crystal grain, 50% or more crystal grain having average crystal grain misorientation equal to or more than 1 degree is present at the area ratio occupying the total area of the layer of complex nitride or complex carbonitride of Ti and Al, thereby alleviating stress in the in-plane direction parallel to the surface of the tool body of the crystal grain and improving toughness of the hard coating layer. As a result, excellent chipping resistance and fracture resistance are exhibited during high-speed intermittent cutting work of alloy steel or the like during which high-temperature heat is generated and impact loads are exerted on a cutting edge.

Further, a polished surface of the layer of the nitride or the carbonitride is analyzed from a direction perpendicular to the surface using an electron beam backward scattering fiffraction device to measure an average inner-grain misorientation of each of the crystal grains having the NaCl type face-centered cubic structure. In this case, in a case where the crystal grains having the average crystal grain misorientation equal to or more than 2 degrees occupy 30% or greater area of the total area of the layer of complex nitride or complex carbonitride, or specifically, in a case where a peak of the frequency distribution of the average crystal grain misorientation and the area ratio thereof is present in a range of the average crystal grain misorientation which is equal to or more than 1 degrere and less than 2 degrees, more excellent chipping resistance and fracture resistance are exhibited, and excellent wear resistance is exhibited during long-term use.

DETAILED DESCRIPTION OF THE INVENTION

Figure 1:
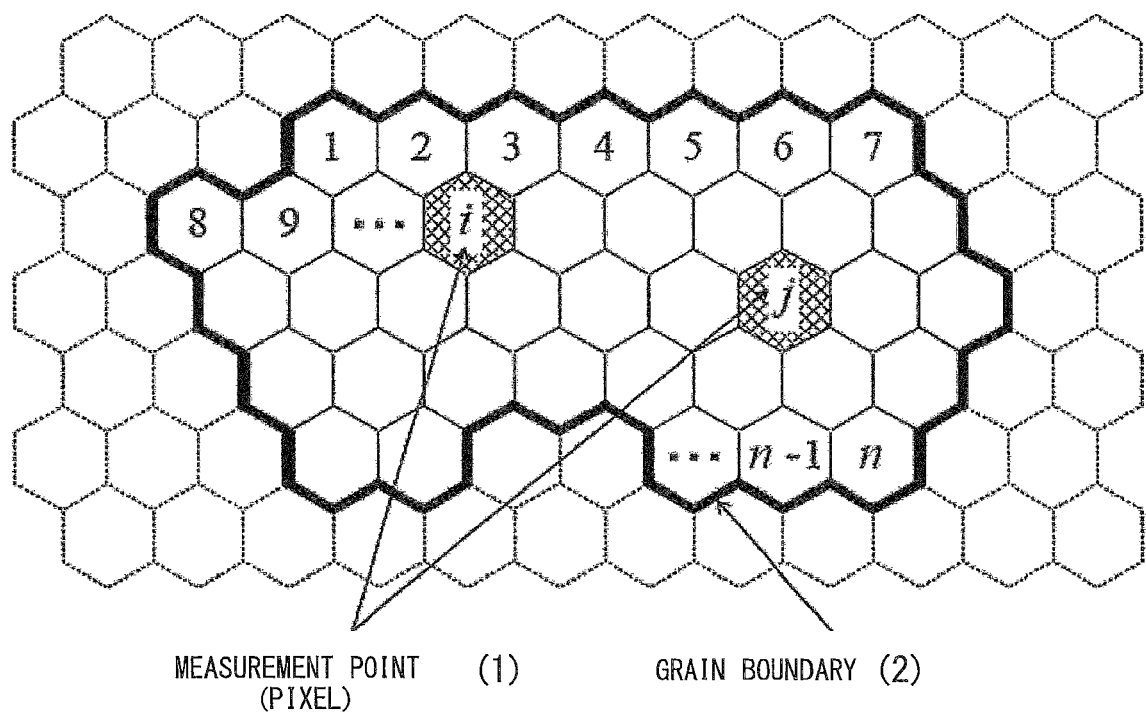
FIG. 1 shows a schematic explanatory diagram of a measurement method of the average crystal grain misorientation of crystal grains of the layer of complex nitride or complex carbonitride of Ti and Al of a coated tool of the present invention, having a NaCl type face-centered cubic structure (cubic).

Next, Examples of the coated tool of the present invention will be described in more detail.

Example 1

As raw material powders, a WC powder, a TiC powder, a TaC powder, an NbC powder, a $Cr_3C_2$ powder, and a Co powder, all of which had an average grain size of 1 to 3 μm, were prepared, and the raw material powders were mixed in blending compositions shown in Table 1. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies A to C made of WC-based cemented carbide with insert shapes according to ISO standard SEEN1203AFSN were produced.

In addition, as raw material powders, a TiCN (TiC/TiN=50/50 in terms of mass ratio) powder, an Mo$_2$C powder, a ZrC powder, an NbC powder, a WC powder, a Co powder, and an Ni powder, all of which had an average grain size of 0.5 to 2 μm, were prepared, and the raw material powders were mixed in blending compositions shown in Table 2, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a tool body D made of TiCN-based cermet with insert shapes according to ISO standard SEEN1203AFSN was produced.

Next, coated tool of the present inventions 1 to 15 were produced by forming a hard coating layer formed of a (Ti$_{1-x}$Al$_x$)(C$_y$N$_{1-y}$) layer which has a target layer thickness shown in Table 7 and in which cubic crystal grains having average crystal grain misorientation shown in Table 7 is present at area ratios shown in Table 7, on surfaces of the tool bodies A to D through a thermal CVD method for a predetermined time using a chemical vapor deposition apparatus, (a) under forming conditions A to J shown in Tables 4 and 5, in which a gas group A of NH$_3$, N$_2$, and H$_2$ and a gas group B of TiCl$_4$, AlCl$_3$, Al(CH$_3$)$_3$, N$_2$, and H$_2$ were used and in each gas supply method, a reaction gas composition (volume % with respect to the total amount of the gas group A and the gas group B) included a gas group A of NH$_3$: 2.0% to 3.0%, N$_2$: 0% to 5%, H$_2$: 45% to 50% and a gas group B of AlCl$_3$: 0.6% to 0.9%, Al(CH$_3$)$_3$: 0% to 0.5%, TiCl$_4$: 0.2% to 0.3%, N$_2$: 10.0% to 12.0%, H$_2$: the balance, a reaction atmosphere pressure was 4.0 kPa to 5.0 kPa, a reaction atmosphere temperature was 700° C. to 900° C., a supply period was 1 second to 5 seconds, a gas supply time per one period was 0.15 to 0.25 seconds, and a phase difference between gas supply A and gas supply B was 0.10 to 0.20 seconds.

In addition, a lower layer shown in Table 6 and/or an upper layer shown in Table 7 were formed on the coated tool of the present inventions 6 to 13 under forming conditions shown in Table 3.

In addition, for the purpose of comparison, hard coating layers including at least a layer of complex nitride or complex carbonitride of Ti and Al were deposited on the surfaces of the tool bodies A to D to have a target layer thickness (μm) shown in FIG. 8 under the conditions shown in Tables 3, 4 and 5, in the same manner as in the coated tool of the present inventions 1 to 15. At this time, coated tool of Comparative Examples 1 to 13 were produced by forming the hard coating layers so that the composition of the reaction gas on the surface of the tool body was not changed over time during a film forming process of a (Ti$_{1-x}$Al$_x$)(C$_y$N$_{1-y}$) layer.

In addition, in the same manner as in the coated tool of the present inventions 6 to 13, a lower layer shown in Table 6 and/or an upper layer shown in Table 8 were formed on the coated tool of Comparative Examples 6 to 13 under forming conditions shown in Table 3.

For reference, reference coated tools 14 and 15 shown in Table 8 were produced by depositing (Ti$_{1-x}$Al$_x$)(C$_y$N$_{1-y}$) layers of a reference example on the surfaces of the tool body B and the tool body C to have target layer thicknesses through arc ion plating using a physical vapor deposition apparatus in the related art.

In addition, conditions of the arc ion plating using the deposition of the reference example are as follows.

(a) The tool bodies B and C were subjected to ultrasonic cleaning in acetone and were dried. In this state, the tool bodies B and C were mounted along outer circumferential portions on a rotating table in an arc ion plating apparatus at positions distant from the center axis by predetermined distances in a radial direction thereof, and a Ti—Al alloy having a predetermined composition was disposed as a cathode electrode (evaporation source).

(b) First, while the inside of the apparatus was evacuated and maintained in a vacuum at 10$^{-2}$ Pa or lower, the inside of the apparatus was heated to 500° C. by a heater, and a DC bias voltage of −1000 V was thereafter applied to the tool body that was rotated while being revolved on the rotating table. In addition, arc discharge was generated by allowing a current of 200 A to flow between the cathode electrode made of the Ti—Al alloy and an anode electrode such that Ti and Al ions were generated in the apparatus and the surface of the tool body was subjected to bombard cleaning.

(c) Next, nitrogen gas as a reaction gas was introduced into the apparatus to form a reaction atmosphere at 4 Pa, and a DC bias voltage of −50 V was applied to the tool body that was rotated while being revolved on the rotating table. In addition, arc discharge was generated by allowing a current of 120 A to flow between the cathode electrode (evaporation source) made of the Ti—Al alloy and the anode electrode such that a (Ti,Al)N layer having a target composition and a target layer thickness shown in Table 8 was deposited on the surface of the tool body, thereby producing the reference coated tools 14 and 15.

The section of each of constituent layers of the coated tool of the present inventions 1 to 15, the coated tool of Comparative Examples 1 to 13, and the reference coated tools 14 and 15 in a direction perpendicular to the tool body was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 7 and 8.

In addition, regarding the average content ratio $x_{avg}$ of Al of the layer of complex nitride or complex carbonitride, a sample of which the surface was polished using an electron probe micro-analyzer (EPMA) was irradiated with electron beams from the sample surface side, and the average content ratio $x_{avg}$ of Al was obtained by averaging 10 points of the analytic result of obtained characteristic X-rays. The average content ratio $y_{avg}$ of C was obtained by secondary ion mass spectrometry (SIMS). Ion beams were emitted toward a range of 70 μm×70 μm from the sample surface side, and the concentration of components emitted by a sputtering action was measured in a depth direction. The average content ratio $y_{avg}$ of C represents the average value in the depth direction of the layer of complex nitride or complex carbonitride of Ti and Al.

However, the amount of C excludes an unavoidable amount of C which is included even though gas containing C is not intentionally used as a gas raw material. Specifically, the amount (atomic ratio) of the component C contained in the layer of complex nitride or complex carbonitride of Ti and Al in a case where the amount of supplied Al(CH$_3$)$_3$ was set to 0 was obtained as the unavoidable amount of C, and a value obtained by subtracting the unavoidable amount of C from the amount (atomic ratio) of the component C contained in the layer of complex nitride or complex carbonitride of Ti and Al obtained in a case where Al(CH$_3$)$_3$ was intentionally supplied is set to y$_{avg}$.

Regarding the polished surface as a surface in a direction perpendicular to the surface of the layer of complex nitride or complex carbonitride of Ti and Al, crystal orientation of each cubic crystal grain of the layer of complex nitride or complex carbonitride of Ti and Al was analyzed by using an electron beam backward scattering diffraction device. In a case where misorientation which was equal to or more than 5 degrees was obtained between adjacent pixels, this point was set as a boundary and a region surrounded by the boundary was set as one crystal grain. The average crystal grain misorientation between the pixel in the crystal grain and all of the other pixels in the same crystal grain was acquired. Mapping was performed by partitioning the ranges of the average crystal grain misorientation which is 0 to 10 degrees by 1 degree, by dividing the ranges into a range of the average crystal grain misorientation equal to or more than 0 degree and less than 1 degree, equal to or more than 1 degree and less than 2 degrees, equal to or more than 2 degrees and less than 3 degrees, equal to or more than 3 degrees and less than 4 degrees, . . . . From this mapped diagram, the area ratio of the crystal grain having the average crystal grain misorientation equal to or more than 1 degree and the crystal grain having the average crystal grain misorientation equal to or more than 2 degrees occupying the total area of the layer of complex nitride or complex carbonitride of Ti and Al was acquired.

In addition, in the frequency distribution of the average crystal grain misorientation and the area ratio thereof, an angle at which a peak was present was acquired.

Results thereof are shown in Tables 7 and 8.

Figure 2:
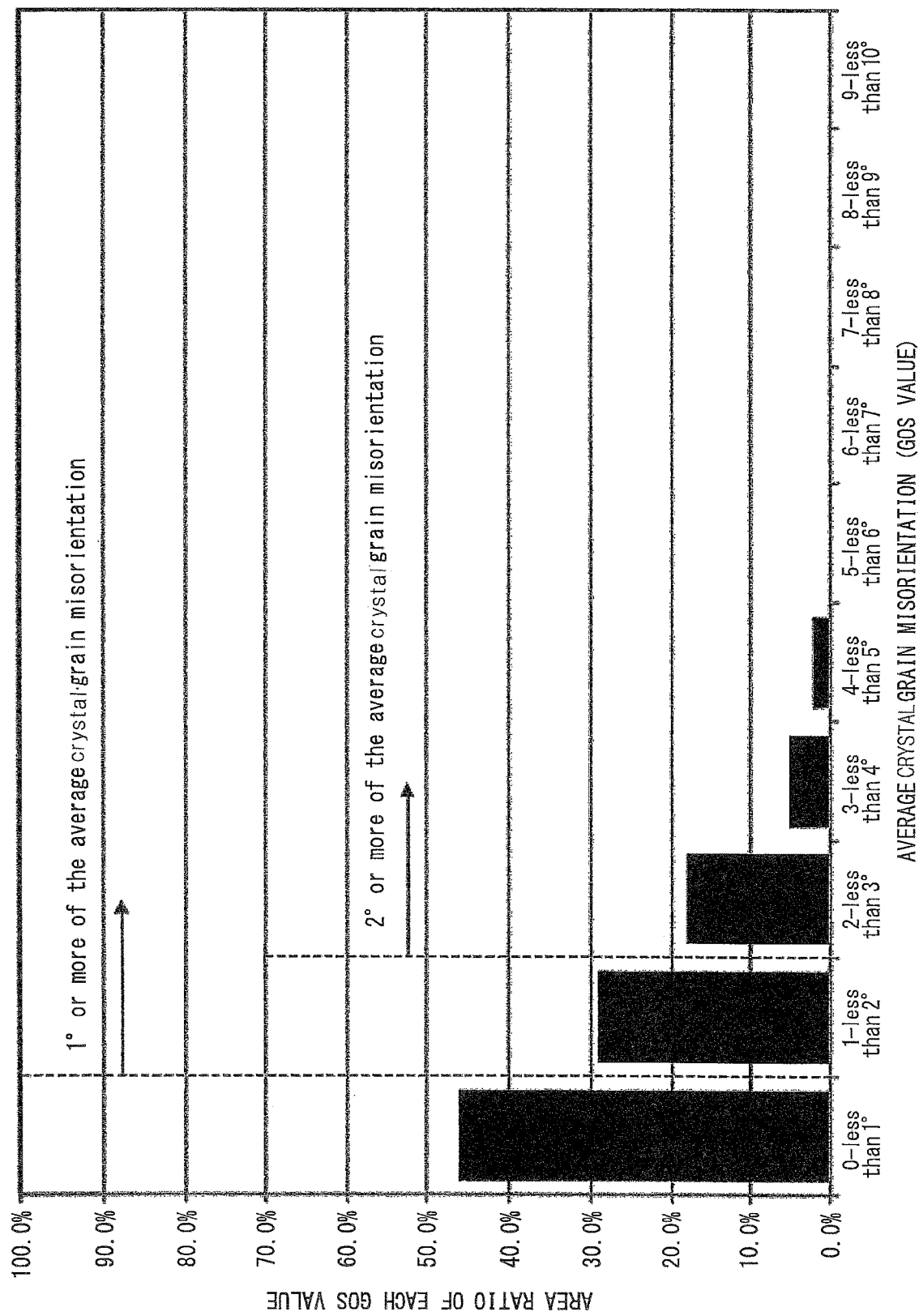
FIG. 2 shows an example of a histogram of the average crystal grain misorientation of the crystal grain of the layer of complex nitride or complex carbonitride of Ti and Al of the coated tool of the present invention, having the NaCl type face-centered cubic structure (cubic).
Figure 3:
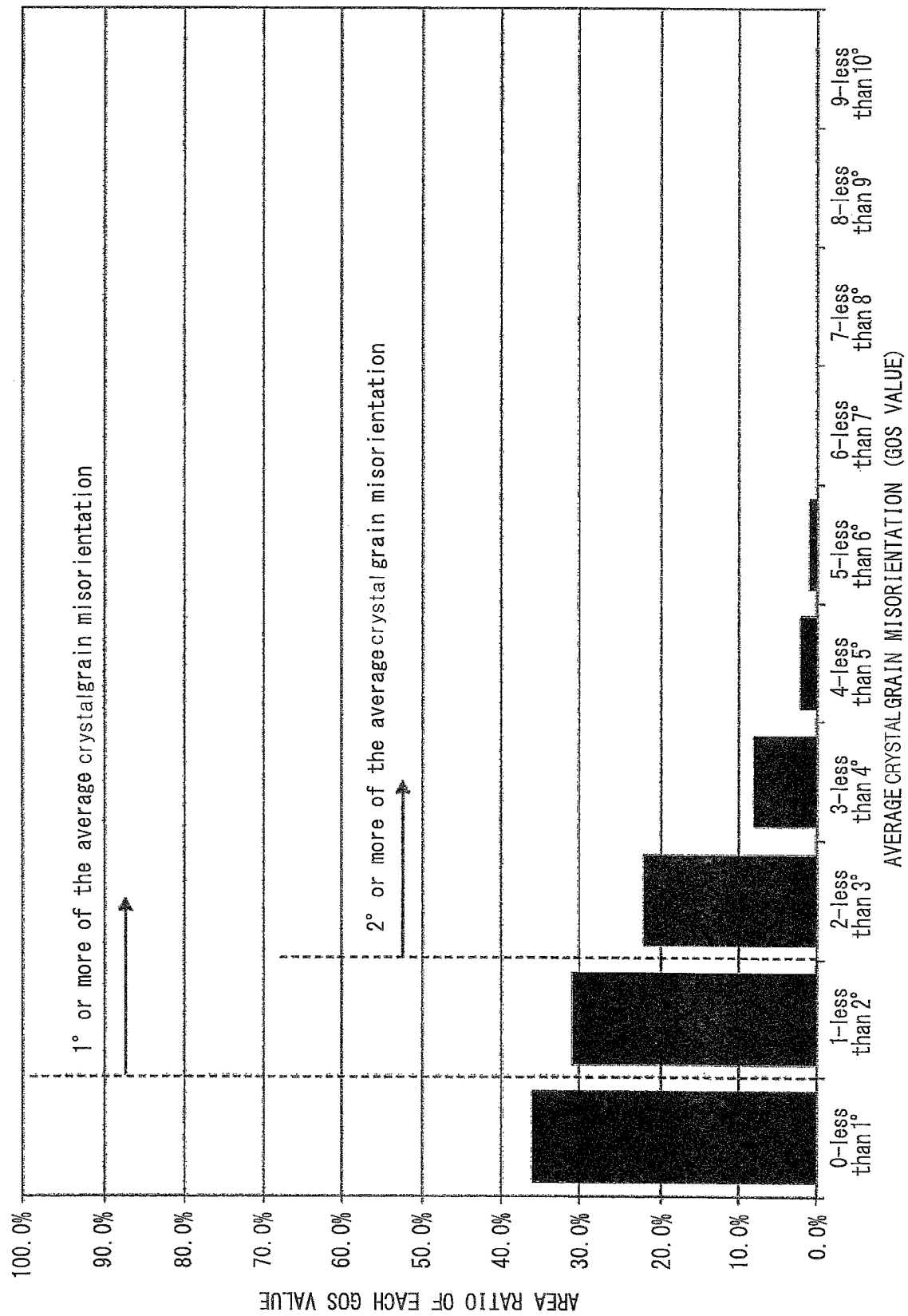
FIG. 3 shows another example of a histogram of the average crystal grain misorientation of the crystal grain of the layer of complex nitride or complex carbonitride of Ti and Al of the coated tool of the present invention, having the NaCl type face-centered cubic structure (cubic).
Figure 4:
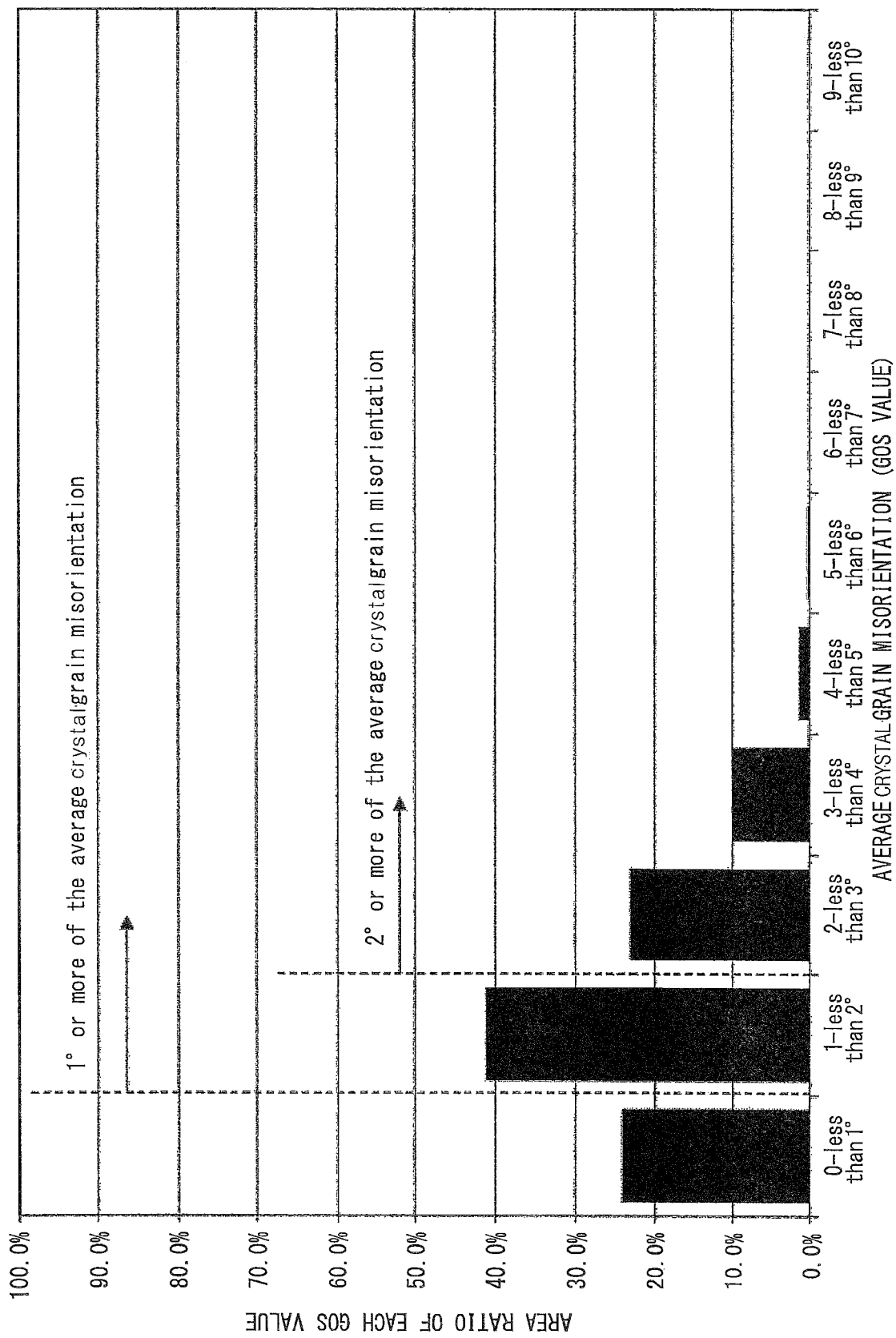
FIG. 4 shows other example of a histogram of the average crystal grain misorientation of the crystal grain of the layer of complex nitride or complex carbonitride of Ti and Al of the coated tool of the present invention, having the NaCl type face-centered cubic structure (cubic).

FIGS. 2 to 4 respectively show the example of the frequency distribution (histograms) of the average crystal grain misorientation (that is, GOS value) measured regarding the coated tool of the present inventions 2, 7, and 12.

TABLE 1

| Type | | Blending composition (mass %) | | | | |
|---|---|---|---|---|---|---|
| | | Co | TiC | TaC | NbC | Cr$_3$C$_2$ | WC |
| Tool body | A | 8.0 | 1.5 | — | 3.0 | 0.4 | balance |
| | B | 8.5 | — | 1.8 | 0.2 | — | balance |
| | C | 7.0 | — | — | — | — | balance |

TABLE 2

| Type | | Blending composition (mass %) | | | | | |
|---|---|---|---|---|---|---|---|
| | | Co | Ni | ZrC | NbC | Mo$_2$C | WC | TiCN |
| Tool body | D | 8 | 5 | 1 | 6 | 6 | 10 | balance |

TABLE 3

| | | | Forming conditions (pressure of reaction atmosphere indicates kPa and temperature indicates ° C.) | | |
|---|---|---|---|---|---|
| Constituent layers of hard coating layer | | Formation symbol | Reaction gas composition (volume %) | Reaction atmosphere | |
| Type | | | | Pressure | Temperature |
| (Ti$_{1-x}$Al$_x$)(C$_y$N$_{1-y}$) layer | TiAlCN | TiAlCN | See Table 4 | See Table 5 | See Table 5 |
| Ti compound layer | TiC | TiC | TiCl$_4$: 4.2%, CH$_4$: 8.5%, H$_2$: balance | 7 | 900 |
| | TiN | TiN-(1) | TiCl$_4$: 4.2%, N$_2$: 30%, H$_2$: balance | 30 | 850 |
| | | TiN-(2) | TiCl$_4$: 4.2%, N$_2$: 35%, H$_2$: balance | 50 | 900 |
| | | TiN-(3) | TiCl$_4$: 4.2%, N$_2$: 30%, H$_2$: balance | 30 | 780 |
| | l-TiCN | l-TiCN-(1) | TiCl$_4$: 2%, CH$_3$CN: 0.7%, N$_2$: 10%, H$_2$: balance | 7 | 900 |
| | | l-TiCN-(2) | TiCl$_4$: 2%, CH$_3$CN: 0.7%, N$_2$: 10%, H$_2$: balance | 7 | 780 |
| | TiCN | TiCN | TiCl$_4$: 2%, CH$_4$: 1%, N$_2$: 15%, H$_2$: balance | 13 | 900 |
| | TiCO | TiCO | TiCl$_4$: 4.2%, CO: 4%, H$_2$: balance | 7 | 900 |
| | TiCNO | TiCNO | TiCl$_4$: 2%, CO: 1%, CH$_4$: 1%, N$_2$: 5%, H$_2$: balance | 13 | 900 |
| Al$_2$O$_3$ layer | Al$_2$O$_3$ | Al$_2$O$_3$ | AlCl$_3$: 2.2%, CO$_2$: 5.5%, HCl: 2.2%, H$_2$S: 0.2%, H$_2$: balance | 7 | 900 |

TABLE 4

| | | Forming conditions (reaction gas composition indicates proportion in total amount of gas group A and gas group B) | |
|---|---|---|---|
| Formation of hard coating layer | | | |
| Process type | Formation symbol | Reaction gas group A composition (volume %) | Reaction gas group B composition (volume %) |
| Film forming | A | NH$_3$: 2.5%, N$_2$: 0.0%, H$_2$: 50%, | AlCl$_3$: 0.7%, TiCl$_4$: 0.2%, N$_2$: 10%, Al(CH$_3$)$_3$: 0%, H$_2$ as balance |

TABLE 4-continued

| Formation of hard coating layer | | Forming conditions (reaction gas composition indicates proportion in total amount of gas group A and gas group B) | |
|---|---|---|---|
| Process type | Formation symbol | Reaction gas group A composition (volume %) | Reaction gas group B composition (volume %) |
| process in the present invention | B | NH$_3$: 3.0%, N$_2$: 5.0%, H$_2$: 50%, | AlCl$_3$: 0.7%, TiCl$_4$: 0.3%, N$_2$: 12%, Al(CH$_3$)$_3$: 0% , H$_2$ as balance |
| | C | NH$_3$: 2.0%, N$_2$: 0.0%, H$_2$: 45%, | AlCl$_3$: 0.9%, TiCl$_4$: 0.3%, N$_2$: 10%, Al(CH$_3$)$_3$: 0.5%, H$_2$ as balance |
| | D | NH$_3$: 3.0%, N$_2$: 0.0%, H$_2$: 50%, | AlCl$_3$: 0.6%, TiCl$_4$: 0.2%, N$_2$: 10%, Al(CH$_3$)$_3$: 0%, H$_2$ as balance |
| | E | NH$_3$: 2.0%, N$_2$: 5.0%, H$_2$: 50%, | AlCl$_3$: 0.8%, TiCl$_4$: 0.3%, N$_2$: 12%, Al(CH$_3$)$_3$: 0%, H$_2$ as balance |
| | F | NH$_3$: 2.5%, N$_2$: 0.0%, H$_2$: 45%, | AlCl$_3$: 0.7%, TiCl$_4$: 0.3%, N$_2$: 12%, Al(CH$_3$)$_3$: 0.2%, H$_2$ as balance |
| | G | NH$_3$: 2.5%, N$_2$: 0.0%, H$_2$: 50%, | AlCl$_3$: 0.6%, TiCl$_4$: 0.2%, N$_2$: 12%, Al(CH$_3$)$_3$: 0%, H$_2$ as balance |
| | H | NH$_3$: 2.5%, N$_2$: 0.0%, H$_2$: 50%, | AlCl$_3$: 0.9%, TiCl$_4$: 0.2%, N$_2$: 10%, Al(CH$_3$)$_3$: 0%, H$_2$ as balance |
| | I | NH$_3$: 2.5%, N$_2$: 0.0%, H$_2$: 50%, | AlCl$_3$: 0.6%, TiCl$_4$: 0.3%, N$_2$: 12%, Al(CH$_3$)$_3$: 0.4%, H$_2$ as balance |
| | J | NH$_3$: 2.5%, N$_2$: 0.0%, H$_2$: 50%, | AlCl$_3$: 0.8%, TiCl$_4$: 0.3%, N$_2$: 12%, Al(CH$_3$)$_3$: 0%, H$_2$ as balance |
| Film forming process in Comparative Example | A' | NH$_3$: 2.5%, N$_2$: 0.0%, H$_2$: 50%, | AlCl$_3$: 0.7%, TiCl$_4$: 0.2%, N$_2$: 10%, Al(CH$_3$)$_3$: 0%, H$_2$ as balance |
| | B' | NH$_3$: 3.0%, N$_2$: 5.0%, H$_2$: 50%, | AlCl$_3$: 0.7%, TiCl$_4$: 0.3%, N$_2$:12%, Al(CH$_3$)$_3$: 0%, H$_2$ as balance |
| | C' | NH$_3$: 2.0%, N$_2$: 0.0%, H$_2$: 45%, | AlCl$_3$: 0.9%, TiCl$_4$: 0.3%, N$_2$: 10%, Al(CH$_3$)$_3$: 0.5%, H$_2$ as balance |
| | D' | NH$_3$: 3.0%, N$_2$: 0.0%, H$_2$: 50%, | AlCl$_3$: 0.6%, TiCl$_4$: 0.2%, N$_2$: 10%, Al(CH$_3$)$_3$: 0%, H$_2$ as balance |
| | E' | NH$_3$: 2.0%, N$_2$: 5.0%, H$_2$: 50%, | AlCl$_3$: 0.8%, TiCl$_4$: 0.3%, N$_2$: 12%, Al(CH$_3$)$_3$: 0%, H$_2$ as balance |
| | F' | NH$_3$: 2.5%, N$_2$: 0.0%, H$_2$: 45%, | AlCl$_3$: 0.7%, TiCl$_4$: 0.3%, N$_2$: 12%, Al(CH$_3$)$_3$: 0.2%, H$_2$ as balance |
| | G' | NH$_3$: 2.5%, N$_2$: 0.0%, H$_2$: 50%, | AlCl$_3$: 0.6%, TiCl$_4$: 0.2%, N$_2$: 12%, Al(CH$_3$)$_3$: 0%, H$_2$ as balance |
| | H' | NH$_3$: 2.5%, N$_2$: 0.0%, H$_2$: 50%, | AlCl$_3$: 0.9%, TiCl$_4$: 0.2%, N$_2$: 10%, Al(CH$_3$)$_3$: 0%, H$_2$ as balance |
| | I' | NH$_3$: 2.5%, N$_2$: 0.0%, H$_2$: 50%, | AlCl$_3$: 0.6%, TiCl$_4$: 0.3%, N$_2$: 12%, Al(CH$_3$)$_3$: 0.4%, H$_2$ as balance |
| | J' | NH$_3$: 2.5%, N$_2$: 0.0%, H$_2$: 50%, | AlCl$_3$: 0.8%, TiCl$_4$: 0.3%, N$_2$: 12%, Al(CH$_3$)$_3$: 0%, H$_2$ as balance |

TABLE 5

| Formation of hard coating layer | | Forming conditions (pressure of reaction atmosphere indicates kPa and temperature indicates ° C.) | | | | | | |
|---|---|---|---|---|---|---|---|---|
| | | Gas group A | | Gas group B | | Phase difference in supply between gas group A and gas group B | Reaction atmosphere | |
| Process type | Formation symbol | Supply period (sec) | Supply time per one period (sec) | Supply period (sec) | Supply time per one period (sec) | (sec) | Pressure | Temperature |
| Film forming process in the present invention | A | 4 | 0.2 | 4 | 0.2 | 0.15 | 5 | 800 |
| | B | 4.5 | 0.2 | 4.5 | 0.2 | 0.1 | 4 | 800 |
| | C | 1 | 0.2 | 1 | 0.2 | 0.15 | 5 | 700 |
| | D | 2.5 | 0.2 | 2.5 | 0.2 | 0.15 | 4 | 800 |
| | E | 3 | 0.15 | 3 | 0.15 | 0.1 | 5 | 850 |
| | F | 2.5 | 0.2 | 2.5 | 0.2 | 0.15 | 4 | 800 |
| | G | 1.2 | 0.25 | 1.2 | 0.25 | 0.2 | 5 | 700 |
| | H | 5 | 0.2 | 5 | 0.2 | 0.1 | 4 | 900 |
| | I | 1.5 | 0.15 | 1.5 | 0.15 | 0.1 | 4 | 800 |
| | J | 2 | 0.25 | 2 | 0.25 | 0.2 | 4 | 750 |
| Film forming process in Comparative Example | A' | — | — | — | — | — | 5 | 800 |
| | B' | — | — | — | — | — | 4 | 800 |
| | C' | — | — | — | — | — | 5 | 700 |
| | D' | — | — | — | — | — | 4 | 800 |
| | E' | — | — | — | — | — | 5 | 850 |
| | F' | — | — | — | — | — | 4 | 800 |
| | G' | — | — | — | — | — | 5 | 700 |

TABLE 5-continued

| | | Forming conditions (pressure of reaction atmosphere indicates kPa and temperature indicates ° C.) | | | | | |
|---|---|---|---|---|---|---|---|
| | | Gas group A | | Gas group B | | Phase difference | |
| Formation of hard coating layer | | Supply period | Supply time per one period | Supply period | Supply time per one period | in supply between gas group A and gas group B | Reaction atmosphere |
| Process type | Formation symbol | (sec) | (sec) | (sec) | (sec) | (sec) | Pressure  Temperature |
| | H' | — | — | — | — | — | 4  900 |
| | I' | — | — | — | — | — | 4  800 |
| | J' | — | — | — | — | — | 4  750 |

TABLE 6

| Type | Tool body symbol | Hard coating layer (numerical value at the bottom indicates target average layer thickness (μm) of layer) Lower layer | | |
|---|---|---|---|---|
| | | First layer | Second layer | Third layer |
| Coated tool of the present invention, Coated tool of Comparative Example, and Reference coated tool | 1  A | — | — | — |
| | 2  B | — | — | — |
| | 3  C | — | — | — |
| | 4  D | — | — | — |
| | 5  A | — | — | — |
| | 6  B | TiC (0.5) | — | — |
| | 7  C | TiN-(1) (0.3) | — | — |
| | 8  D | TiN-(1) (0.5) | l-TiCN-(1) (4) | — |
| | 9  A | TiN-(1) | l-TiCN-(1) | TiCN |
| | 10  B | (0.3) | (2) | (0.7) |
| | 11  C | TiN-(1) (0.5) | — | — |
| | 12  D | TiC (1) | — | — |
| | 13  A | TiN-(1) (0.1) | — | — |
| | 14  B | — | — | — |
| | 15  C | — | — | — |

TABLE 7

| | | | Hard coating layer | | | | | | | |
|---|---|---|---|---|---|---|---|---|---|---|
| | | | TiAl complex nitride, carbonitride layer $(Ti_{1-x}Al_x)(C_yN_{1-y})$ | | | | | | Upper layer (numerical value at the bottom indicates target average layer thickness (μm) of layer) | |
| Type | Tool body symbol | TiAlCN film forming process formation symbol (see Tables 4 and 5) | Average content ratio oa Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) | Angle at which peak of frequency distribution of the average crystal grain misorientation is present (degree) | Target layer thickness (μm) | First layer | Second layer |
| Coated tool of the present invention | 1  A | A | 0.94 | 0.0001 or less | 61 | 29 | 0° or more and less than 1° | 6 | — | — |
| | 2  B | B | 0.75 | 0.0001 or less | 54 | 25 | 0° or more and less than 1° | 7 | — | — |
| | 3  C | C | 0.78 | 0.0018 | 52 | 22 | 1° or more and less than 2° | 3 | — | — |
| | 4  D | D | 0.75 | 0.0001 or less | 65 | 36 | 1° or more and less than 2° | 10 | — | — |
| | 5  A | E | 0.95 | 0.0001 or less | 67 | 35 | 1° or more and less than 2° | 2 | — | — |
| | 6  B | F | 0.67 | 0.0022 | 50 | 30 | 0° or more and less than 1° | 4 | — | — |
| | 7  D | G | 0.83 | 0.0001 or less | 64 | 33 | 0° or more and less than 1° | 6 | — | — |
| | 8  C | H | 0.92 | 0.0001 or less | 58 | 27 | 0° or more and less than 1° | 1 | — | — |
| | 9  A | I | 0.67 | 0.0046 | 70 | 38 | 1° or more and less than 2° | 7 | — | — |
| | 10  B | J | 0.60 | 0.0001 or less | 62 | 28 | 0° or more and less than 1° | 6 | $Al_2O_3$ (2.5) | — |

TABLE 7-continued

| | | | | | Hard coating layer | | | | | |
|---|---|---|---|---|---|---|---|---|---|---|
| | | | TiAl complex nitride, carbonitride layer $(Ti_{1-x}Al_x)(C_yN_{1-y})$ | | | | | | | |
| Type | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) | Angle at which peak of frequency distribution of the average crystal grain misorientation is present (degree) | Target layer thickness (μm) | Upper layer (numerical value at the bottom indicates target average layer thickness (μm) of layer) First layer | Second layer |
| | 11 C | A | 0.95 | 0.0001 or less | 50 | 21 | 0° or more and less than 1° | 4 | TiCN (0.5) | $Al_2O_3$ (3) |
| | 12 D | B | 0.76 | 0.0001 or less | 76 | 35 | 1° or more and less than 2° | 3 | TiCO (1) | $Al_2O_3$ (2) |
| | 13 A | C | 0.78 | 0.0017 | 56 | 27 | 0° or more and less than 1° | 2 | TiCNO (0.3) | $Al_2O_3$ (1) |
| | 14 B | D | 0.74 | 0.0001 or less | 63 | 32 | 0° or more and less than 1° | 9 | — | — |
| | 15 C | E | 0.90 | 0.0001 or less | 62 | 30 | 0° or more and less than 1° | 5 | — | — |

TABLE 8

| | | | | | Hard coating layer | | | | | |
|---|---|---|---|---|---|---|---|---|---|---|
| | | | TiAl complex nitride, carbonitride layer $(Ti_{1-x}Al_x)(C_yN_{1-y})$ | | | | | | | |
| Type | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) | Angle at which peak of frequency distribution of the average crystal grain misorientation is present (degree) | Target layer thickness (μm) | Upper layer (numerical value at the bottom indicates target average layer thickness (μm) of layer) First layer | Second layer |
| Coated tool of Comparative Example | 1 A | A' | 0.91 | 0.0001 or less | 15 | 8 | 0° or more and less than 1° | 6 | — | — |
| | 2 B | B' | 0.79 | 0.0001 or less | 18 | 10 | 0° or more and less than 1° | 7 | — | — |
| | 3 C | C' | 0.82 | 0.0016 | 2 | 0 | 0° or more and less than 1° | 3 | — | — |
| | 4 D | D' | 0.74 | 0.0001 or less | 17 | 14 | 0° or more and less than 1° | 10 | — | — |
| | 5 A | E' | 0.91 | 0.0001 or less | 5 | 3 | 0° or more and less than 1° | 2 | — | — |
| | 6 B | F' | 0.69 | 0.0024 | 7 | 6 | 0° or more and less than 1° | 4 | — | — |
| | 7 D | G' | 0.80 | 0.0001 or less | 8 | 7 | 0° or more and less than 1° | 6 | — | — |
| | 8 C | H' | 0.90 | 0.0001 or less | 2 | 1 | 0° or more and less than 1° | 1 | — | — |
| | 9 A | I' | 0.66 | 0.0043 | 5 | 4 | 0° or more and less than 1° | 7 | — | — |
| | 10 B | J' | 0.60 | 0.0001 or less | 11 | 7 | 0° or more and less than 1° | 6 | $Al_2O_3$ (2.5) | — |
| | 11 C | A' | 0.92 | 0.0001 or less | 14 | 12 | 0° or more and less than 1° | 4 | TiCN (0.5) | $Al_2O_3$ (3) |
| | 12 D | B' | 0.75 | 0.0001 or less | 17 | 13 | 0° or more and less than 1° | 3 | TiCO (1) | $Al_2O_3$ (2) |
| | 13 A | C' | 0.84 | 0.0021 | 5 | 4 | 0° or more and less than 1° | 2 | TiCNO (0.3) | $Al_2O_3$ (1) |
| Reference coated tool | 14 B | AIP | 0.51 | 0.0001 or less | 3 | 1 | 0° or more and less than 1° | 9 | — | — |
| | 15 C | AIP | 0.58 | 0.0001 or less | 6 | 2 | 0° or more and less than 1° | 5 | — | — |

TABLE 8-continued

| | | | | | Hard coating layer | | | | |
| --- | --- | --- | --- | --- | --- | --- | --- | --- | --- |
| | | | | | TiAl complex nitride, carbonitride layer $(Ti_{1-x}Al_x)(C_yN_{1-y})$ | | | | |
| Type | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) | Angle at which peak of frequency distribution of the average crystal grain misorientation is present (degree) | Target layer thickness (μm) | Upper layer (numerical value at the bottom indicates target average layer thickness (μm) of layer) | |
| | | | | | | | | | First layer | Second layer |

(Note)
"AIP" indicates a film forming through arc ion plating.

Next, in a state in which each of the various coated tools was clamped to a cutter tip end portion made of tool steel with a cutter diameter of 125 mm by a fixing tool, the coated tool of the present inventions 1 to 15, the coated tool of Comparative Examples 1 to 13, and the reference coated tools 14 and 15 were subjected to dry high-speed face milling, which is a type of high-speed intermittent cutting of alloy steel, and a center-cut cutting test, which are described below, and the flank wear width of a cutting edge was measured. Results thereof are shown in Table 9.

Tool body: tungsten carbide-based cemented carbide, titanium carbonitride-based cermet
Cutting test: dry high-speed face milling, center-cut cutting
Work material: a block material of JIS SCM440 with a width of 100 mm and a length of 400 mm
Rotational speed: 930 min$^{-1}$
Cutting speed: 360 m/min
Depth of cut: 2.0 mm
Feed per edge: 0.10 mm/edge
Cutting time: 8 minutes

TABLE 9

| Type | | Flank wear width (mm) | Type | | Cutting test results (min) |
| --- | --- | --- | --- | --- | --- |
| Coated tool of the present invention | 1 | 0.10 | Coated tool of Comparative Example | 1 | 4.3* |
| | 2 | 0.11 | | 2 | 3.2* |
| | 3 | 0.10 | | 3 | 3.1* |
| | 4 | 0.08 | | 4 | 2.2* |
| | 5 | 0.09 | | 5 | 4.6* |
| | 6 | 0.09 | | 6 | 3.7* |
| | 7 | 0.09 | | 7 | 4.1* |
| | 8 | 0.11 | | 8 | 2.3* |
| | 9 | 0.07 | | 9 | 3.6* |
| | 10 | 0.13 | | 10 | 4.5* |
| | 11 | 0.12 | | 11 | 4.8* |
| | 12 | 0.07 | | 12 | 2.4* |
| | 13 | 0.14 | | 13 | 4.0* |
| | 14 | 0.09 | Reference coated tool | 14 | 1.9* |
| | 15 | 0.10 | | 15 | 1.6* |

Mark * in boxes of coated tool of Comparative Examples and reference coated tools indicates a cutting time (min) until the end of a service life caused by the occurrence of chipping.

Example 2

As raw material powders, a WC powder, a TiC powder, a ZrC powder, a TaC powder, an NbC powder, a $Cr_3C_2$ powder, a TiN powder, and a Co powder, all of which had an average grain size of 1 to 3 μm, were prepared, and the raw material powders were mixed in blending compositions shown in Table 10. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, a cutting edge portion was subjected to honing to have a radius R of 0.07 mm, thereby forming tool bodies E to G made of WC-based cemented carbide with insert shapes according to ISO standard CNMG120412.

In addition, as raw material powders, a TiCN (TiC/TiN=50/50 in terms of mass ratio) powder, an NbC powder, a WC powder, a Co powder, and an Ni powder, all of which had an average grain size of 0.5 to 2 μm, were prepared, and the raw material powders were mixed in blending compositions shown in Table 11, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a cutting edge portion was subjected to honing to have a radius R of 0.09 mm, thereby forming a tool body H made of TiCN-based cermet with an insert shape according to ISO standard CNMG120412.

Subsequently, Coated tool of the present inventions 16 to 30 shown in Table 13 were produced by depositing hard coating layers including at least a $(Ti_{1-x}Al_x)(C_yN_{1-y})$ layer on the surfaces of the tool bodies E to G and the tool body H to have target layer thicknesses using a chemical vapor deposition apparatus under the conditions shown in Tables 3 and 4 in the same method as that in Example 1.

In addition, a lower layer shown in Table 12 and/or an upper layer shown in Table 13 were formed on the coated tool of the present inventions 19 to 28 under the forming conditions shown in Table 3.

In addition, for the purpose of comparison, in the same manner as in the coated tool of the present inventions, coated tool of Comparative Examples 16 to 28 shown in Table 14 were produced by depositing hard coating layers on the surfaces of the same tool bodies E to G and the tool body H to have target layer thicknesses shown in Table 14 under the conditions shown in Tables 3 and 4 using a typical chemical vapor deposition apparatus.

In addition, in the same manner as in the coated tool of the present inventions 19 to 28, a lower layer shown in Table 12 and/or an upper layer shown in Table 14 were formed on the coated tool of Comparative Examples 19 to 28 under the forming conditions shown in Table 3.

For reference, reference coated tools 29 and 30 shown in Table 14 were produced by depositing $(Ti_{1-x}Al_x)(C_yN_{1-y})$ layers of the reference example on the surfaces of the tool body F and the tool body G to have target layer thicknesses through arc ion plating using a physical vapor deposition apparatus in the related art.

The same conditions as those described in Example 1 were used as the conditions of the arc ion plating.

The section of each of constituent layers of the coated tool of the present inventions 16 to 30, the coated tool of Comparative Examples 16 to 28, and the reference coated tools 29 and 30 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 13 and 14.

Regarding the hard coating layers of the coated tool of the present inventions 16 to 30, the coated tool of Comparative Examples 16 to 28, and the reference coated tools 29 and 30, the average content ratio $x_{avg}$ of Al and the average content ratio $y_{avg}$ of C were acquired, in the same manner as in Example 1.

Measurement results are shown in Tables 13 and 14.

Regarding the polished surface as a surface in a direction perpendicular to the surface of the layer of complex nitride or complex carbonitride of Ti and Al, crystal orientation of each cubic crystal grain of the layer of complex nitride or complex carbonitride of Ti and Al was analyzed by using an electron beam backward scattering diffraction device, and mapping was performed by partitioning the ranges of the average crystal grain misorientation which is 0 to 10 degrees by 1 degree, by partitioning the ranges into a range of the average crystal grain misorientation equal to or more than 0 degree and less than 1 degree, equal to or more than 1 degree and less than 2 degrees, equal to or more than 2 degrees and less than 3 degrees, equal to or more than 2 degrees and less than 4 degrees, . . . . From this mapped diagram, the average crystal grain misorientation and the area ratio of the crystal grain having the average crystal grain misorientation equal to or more than 1 degree and the crystal grain having the average crystal grain misorientation equal to or more than 2 degrees occupying the total area of the layer of complex nitride or complex carbonitride Ti and Al were acquired.

In addition, in the frequency distribution of the average crystal grain misorientation and the area ratio thereof, an angle at which a peak was present was acquired.

Results thereof are shown in Tables 13 and 14.

TABLE 10

| | | Blending composition (mass %) | | | | | | |
|---|---|---|---|---|---|---|---|---|
| Type | | Co | TiC | ZrC | TaC | NbC | $Cr_3C_2$ | TiN | WC |
| Tool body | E | 6.5 | — | 1.5 | — | 2.9 | 0.1 | 1.5 | balance |
| | F | 7.6 | 2.6 | — | 4.0 | 0.5 | — | 1.1 | balance |
| | G | 6.0 | — | — | — | — | — | — | balance |

TABLE 11

| | | Blending composition (mass %) | | | | |
|---|---|---|---|---|---|---|
| Type | | Co | Ni | NbC | WC | TiCN |
| Tool body | H | 11 | 4 | 6 | 15 | balance |

TABLE 12

| | Tool body symbol | Hard coating layer (numerical value at the bottom indicates target average layer thickness (μm) of layer) | | | |
|---|---|---|---|---|---|
| | | Lower layer | | | |
| Type | | First layer | Second layer | Third layer | Fourth layer |
| Coated tool of the present invention, Coated tool of Comparative Example, and Reference coated tool | 16 E | — | — | — | — |
| | 17 F | — | — | — | — |
| | 18 G | — | — | — | — |
| | 19 H | TiC (0.5) | — | — | — |
| | 20 E | TiN-(1) (0.1) | — | — | — |
| | 21 F | TiN-(1) (0.5) | l-TiCN-(1) (7) | — | — |
| | 22 G | TiN-(1) (0.3) | l-TiCN-(1) (10) | TiN-(2) (0.7) | — |
| | 23 H | TiN-(1) (0.3) | l-TiCN-(1) (4) | TiCN (0.4) | TiN-(2) (0.3) |
| | 24 E | — | — | — | — |
| | 25 F | TiN-(1) (0.5) | — | — | — |
| | 26 G | TiC (1) | — | — | — |
| | 27 H | TiN-(1) (0.1) | — | — | — |
| | 28 E | TiN-(1) (0.1) | — | — | — |
| | 29 F | — | — | — | — |
| | 30 G | — | — | — | — |

TABLE 13

| | | | Hard coating layer | | | | |
|---|---|---|---|---|---|---|---|
| | | | TiAl complex nitride, carbonitride layer $(Ti_{1-x}Al_x)(C_yN_{1-y})$ | | | | |
| Type | | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) |
| Coated tool of the present invention | 16 | E | A | 0.95 | 0.0001 or less | 62 | 27 |
| | 17 | F | B | 0.76 | 0.0001 or less | 53 | 24 |
| | 18 | G | C | 0.79 | 0.0019 | 51 | 22 |
| | 19 | H | D | 0.75 | 0.0001 or less | 64 | 36 |
| | 20 | E | E | 0.93 | 0.0001 or less | 67 | 34 |
| | 21 | F | F | 0.67 | 0.0029 | 51 | 30 |
| | 22 | G | G | 0.83 | 0.0001 or less | 65 | 32 |
| | 23 | H | H | 0.93 | 0.0001 or less | 58 | 28 |
| | 24 | E | I | 0.68 | 0.0039 | 70 | 38 |
| | 25 | F | J | 0.60 | 0.0001 or less | 61 | 28 |
| | 26 | G | A | 0.95 | 0.0001 or less | 61 | 28 |
| | 27 | H | B | 0.76 | 0.0001 or less | 54 | 25 |
| | 28 | E | C | 0.79 | 0.0017 | 51 | 21 |
| | 29 | F | D | 0.75 | 0.0001 or less | 65 | 25 |
| | 30 | G | E | 0.93 | 0.0001 or less | 67 | 31 |

| | | Hard coating layer | | | | | |
|---|---|---|---|---|---|---|---|
| | | TiAl complex nitride, carbonitride layer $(Ti_{1-x}Al_x)(C_yN_{1-y})$ | | Upper layer (numerical value at the bottom indicates target average layer thickness (μm) of layer) | | | |
| Type | | Angle at which peak of frequency distribution of the average crystal grain misorientation is present (degree) | Target layer thickness (μm) | First layer | Second layer | Third layer | Fourth layer |
| Coated tool of the present invention | 16 | 0° or more and less than 1° | 7 | — | — | — | — |
| | 17 | 1° or more and less than 2° | 2 | — | — | — | — |
| | 18 | 0° or more and less than 1° | 8 | — | — | — | — |
| | 19 | 1° or more and less than 2° | 15 | — | — | — | — |
| | 20 | 1° or more and less than 2° | 13 | — | — | — | — |
| | 21 | 0° or more and less than 1° | 8 | — | — | — | — |
| | 22 | 0° or more and less than 1° | 20 | TiN-(2) (0.7) | — | — | — |
| | 23 | 0° or more and less than 1° | 16 | TiCN (0.4) | TiN-(2) (0.3) | — | — |
| | 24 | 1° or more and less than 2° | 4 | $Al_2O_3$ (2) | — | — | — |
| | 25 | 0° or more and less than 1° | 8 | TiCN (0.5) | $Al_2O_3$ (2.5) | — | — |
| | 26 | 0° or more and less than 1° | 3 | TiCO (1) | $Al_2O_3$ (2) | — | — |
| | 27 | 0° or more and less than 1° | 9 | TiCNO (0.3) | $Al_2O_3$ (1) | — | — |

TABLE 13-continued

| | | | | | | | |
|---|---|---|---|---|---|---|---|
| 28 | 1° or more and less than 2° | | 4 | TiN-(2) (0.3) | TiCN (0.8) | TiCNO (0.3) | $Al_2O_3$ (3) |
| 29 | 1° or more and less than 2° | | 11 | — | — | — | — |
| 30 | 1° or more and less than 2° | | 9 | — | — | — | — |

TABLE 14

Hard coating layer

TiAl complex nitride, carbonitride layer $(Ti_{1-x}Al_x)(C_yN_{1-y})$

| Type | | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) |
|---|---|---|---|---|---|---|---|
| Coated tool of Comparative Example | 16 | E | A' | 0.92 | 0.0001 or less | 13 | 8 |
| | 17 | F | B' | 0.78 | 0.0001 or less | 17 | 9 |
| | 18 | G | C' | 0.82 | 0.0024 | 2 | 0 |
| | 19 | H | D' | 0.72 | 0.0001 or less | 17 | 11 |
| | 20 | E | E' | 0.92 | 0.0001 or less | 5 | 3 |
| | 21 | F | F' | 0.69 | 0.0035 | 7 | 6 |
| | 22 | G | G' | 0.81 | 0.0001 or less | 7 | 5 |
| | 23 | H | H' | 0.89 | 0.0001 or less | 2 | 1 |
| | 24 | E | I' | 0.65 | 0.0042 | 5 | 3 |
| | 25 | F | J' | 0.61 | 0.0001 or less | 10 | 5 |
| | 26 | G | A' | 0.93 | 0.0001 or less | 14 | 7 |
| | 27 | H | B' | 0.78 | 0.0001 or less | 17 | 9 |
| | 28 | E | C' | 0.81 | 0.0019 | 5 | 3 |
| Reference coated tool | 29 | F | AIP | 0.50 | 0.0001 or less | 3 | 1 |
| | 30 | G | AIP | 0.59 | 0.0001 or less | 6 | 2 |

Hard coating layer

TiAl complex nitride, carbonitride layer $(Ti_{1-x}Al_x)(C_yN_{1-y})$

| Type | | Angle at which peak of frequency distribution of the average crystal grain misorientation is present (degree) | Target layer thickness (μm) | Upper layer (numerical value at the bottom indicates target average layer thickness (μm) of layer) | | | |
|---|---|---|---|---|---|---|---|
| | | | | First layer | Second layer | Third layer | Fourth layer |
| Coated tool of Comparative Example | 16 | 0° or more and less than 1° | 7 | — | — | — | — |
| | 17 | 0° or more and less than 1° | 2 | — | — | — | — |
| | 18 | 0° or more and less than 1° | 8 | — | — | — | — |
| | 19 | 0° or more and less than 1° | 15 | — | — | — | — |
| | 20 | 0° or more and less than 1° | 13 | — | — | — | — |

TABLE 14-continued

| | | | | | | | |
|---|---|---|---|---|---|---|---|
| | 21 | 0° or more and less than 1° | 8 | — | — | — | — |
| | 22 | 0° or more and less than 1° | 20 | TiN-(2) (0.7) | — | — | — |
| | 23 | 0° or more and less than 1° | 16 | TiCN (0.4) | TiN-(2) (0.3) | — | — |
| | 24 | 0° or more and less than 1° | 4 | $Al_2O_3$ (2) | — | — | — |
| | 25 | 0° or more and less than 1° | 8 | TiCN (0.5) | $Al_2O_3$ (2.5) | — | — |
| | 26 | 0° or more and less than 1° | 3 | TiCO (1) | $Al_2O_3$ (2) | — | — |
| | 27 | 0° or more and less than 1° | 9 | TiCNO (0.3) | $Al_2O_3$ (1) | — | — |
| | 28 | 0° or more and less than 1° | 4 | TiN-(2) (0.3) | TiCN (0.8) | TiCNO (0.3) | $Al_2O_3$ (3) |
| Reference coated tool | 29 | 0° or more and less than 1° | 11 | — | — | — | — |
| | 30 | 0° or more and less than 1° | 9 | — | — | — | — |

(Note)
"AIP" indicates a film forming through arc ion plating.

Next, in a state in which each of the various coated tools was screwed to a tip end portion of an insert holder made of tool steel by a fixing tool, the coated tool of the present inventions 16 to 30, the coated tool of Comparative Examples 16 to 28, and the reference coated tools 29 and 30 were subjected to a dry high-speed intermittent cutting test for alloy steel and a wet high-speed intermittent cutting test for cast iron, which are described below, and the flank wear width of a cutting edge was measured.

Cutting conditions 1:
Work material: a round bar of JIS SCM435 with four longitudinal grooves formed with equal intervals in the longitudinal direction
Cutting speed: 390 m/min
Depth of cut: 1.5 mm
Feed rate: 0.1 mm/rev
Cutting time: 5 minutes
(a typical cutting speed is 220 m/min)
Cutting conditions 2:
Work material: a round bar of JIS FCD700 with four longitudinal grooves formed with equal intervals in the longitudinal direction
Cutting speed: 330 m/min
Depth of cut: 1.2 mm
Feed rate: 0.15 mm/rev
Cutting time: 5 minutes
(a typical cutting speed is 200 m/min)
The results of the cutting test are shown in Table 15.

TABLE 15

| | | Flank wear width (mm) | | | | Cutting test results (min) | |
|---|---|---|---|---|---|---|---|
| Type | | Cutting conditions 1 | Cutting conditions 2 | Type | | Cutting conditions 1 | Cutting conditions 2 |
| Coated tool of the present invention | 16 | 0.22 | 0.23 | Coated tool of Comparative Example | 16 | 3.1* | 4.1* |
| | 17 | 0.22 | 0.23 | | 17 | 3.8* | 3.1* |
| | 18 | 0.25 | 0.23 | | 18 | 3.9* | 4.7* |
| | 19 | 0.14 | 0.14 | | 19 | 4.5* | 4.8* |
| | 20 | 0.13 | 0.15 | | 20 | 2.3* | 2.1* |
| | 21 | 0.22 | 0.18 | | 21 | 4.2* | 2.0* |
| | 22 | 0.18 | 0.20 | | 22 | 1.9* | 4.5* |
| | 23 | 0.23 | 0.25 | | 23 | 3.1* | 3.1* |
| | 24 | 0.15 | 0.16 | | 24 | 4.7* | 3.8* |
| | 25 | 0.25 | 0.26 | | 25 | 4.8* | 3.9* |
| | 26 | 0.23 | 0.22 | | 26 | 4.3* | 4.5* |
| | 27 | 0.12 | 0.13 | | 27 | 2.9* | 2.3* |
| | 28 | 0.26 | 0.24 | | 28 | 4.8* | 4.2* |
| | 29 | 0.22 | 0.22 | Reference coated tool | 29 | 2.1* | 1.9* |
| | 30 | 0.22 | 0.22 | | 30 | 2.0* | 1.8* |

Mark * in boxes of coated tool of Comparative Examples and reference coated tools indicates a cutting time (min) until the end of a service life caused by the occurrence of chipping.

Example 3

As raw material powders, a cBN powder, a TiN powder, a TiC powder, an Al powder, and an $Al_2O_3$ powder, all of which had an average grain size of 0.5 to 4 μm, were prepared, and the raw material powders were mixed in blending compositions shown in Table 16. The mixture was wet-blended by a ball mill for 80 hours and was dried. Thereafter, the resultant was press-formed into green compacts having dimensions with a diameter of 50 mm and a thickness of 1.5 mm at a pressure of 120 MPa, and the green compacts were then sintered in a vacuum at a pressure of 1 Pa under the condition that the green compacts were held at a predetermined temperature in a range of 900° C. to 1300° C. for 60 minutes, thereby producing cutting edge preliminary sintered bodies. In a state in which the preliminarily sintered material was superimposed on a support piece made of WC-based cemented carbide, which was additionally prepared to contain Co: 8 mass % and WC: the balance and have dimensions with a diameter of 50 mm and a thickness of 2 mm, the resultant was loaded in a typical ultrahigh-pressure sintering apparatus, and was subjected to ultrahigh-pressure sintering under typical conditions including a pressure of 4 GPa, a predetermined temperature in a range of 1200° C. to 1400° C., and a holding time of 0.8 hours. After the sintering, upper and lower surfaces were polished using a diamond grinding wheel, and were split into predetermined dimensions by a wire electric discharge machining apparatus. Furthermore, the resultant was brazed to a brazing portion (corner portion) of an insert body made of WC-based cemented carbide having a composition including Co: 5 mass %, TaC: 5 mass %, and WC: the balance and a shape (a 80° rhombic shape with a thickness of 4.76 mm and an inscribed circle diameter of 12.7 mm) according to ISO standard CNGA120408 using a brazing filler metal made of a Ti—Zr—Cu alloy having a composition including Zr: 37.5%, Cu: 25%, and Ti: the balance in terms of mass %, and the outer circumference thereof was machined into predetermined dimensions. Thereafter, a cutting edge portion was subjected to honing to have a width of 0.13 mm and an angle of 25°, and the resultant was further subjected to finish polishing, thereby producing each of tool bodies J and K with an insert shape according to ISO standard CNGA120408.

TABLE 16

| Type | | Blending composition (mass %) | | | | |
|---|---|---|---|---|---|---|
| | | TiN | TiC | Al | $Al_2O_3$ | cBN |
| Tool body | J | 50 | — | 5 | 3 | balance |
| | K | — | 50 | 4 | 3 | balance |

Next, coated tool of the present inventions 31 to 40 shown in Table 18 were produced by depositing hard coating layers including at least a $(Ti_{1-x}Al_x)(C_yN_{1-y})$ layer on the surfaces of the tool bodies J and K using a chemical vapor deposition apparatus to have target layer thicknesses under the conditions shown in Tables 3 and 4 in the same method as that in Example 1.

In addition, a lower layer shown in Table 17 and/or an upper layer shown in Table 18 were formed on the coated tool of the present inventions 34 to 38 under the forming conditions shown in Table 3.

In addition, for the purpose of comparison, coated tool of Comparative Examples 31 to 38 shown in Table 19 were produced by depositing hard coating layers including at least a $(Ti_{1-x}Al_x)(C_yN_{1-y})$ layer on the surfaces of the same tool bodies J and K to have target layer thicknesses under the conditions shown in Tables 3 and 4 using a typical chemical vapor deposition apparatus.

In addition, in the same manner as in the coated tool of the present inventions 34 to 38, a lower layer shown in Table 17 and/or an upper layer shown in Table 19 were formed on the coated tool of Comparative Examples 34 to 38 under the forming conditions shown in Table 3.

For reference, reference coated tools 39 and 40 shown in Table 19 were produced by depositing $(Ti_{1-x}Al_x)(C_yN_{1-y})$ layers on the surfaces of the tool bodies J and K to have target layer thicknesses through arc ion plating using a physical vapor deposition apparatus in the related art.

The same conditions as those described in Example 1 were used as the conditions of the arc ion plating, and the reference coated tools 39 and 40 were produced by depositing (Al,Ti)N layers having a target composition and a target layer thickness shown in Table 19 on the surfaces of the tool bodies.

The section of each of constituent layers of the coated tool of the present inventions 31 to 40, the coated tool of Comparative Examples 31 to 38, and the reference coated tools 39 and 40 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 18 and 19.

Regarding the hard coating layers of the coated tool of the present inventions 31 to 40, the coated tool of Comparative Examples 31 to 38, and the reference coated tools 39 and 40, using the same method as that described in Example 1, the average content ratio $x_{avg}$ of Al, the average content ratio $y_{avg}$ of C, the area ratio of the crystal grain having the average crystal grain misorientation of the cubic crystal grains composing the $(Ti_{1-x}Al_x)(C_yN_{1-y})$ layer equal to or more than 1 degree, the area ratio of the crystal grain having the average crystal grain misorientation equal to or more than 2 degrees, an angle at which a peak is present in the frequency distribution of the average crystal grain misorientation and the area ratio thereof were acquired.

The results thereof are shown in Tables 18 and 19.

TABLE 17

| | | Hard coating layer (numerical value at the bottom indicates target average layer thickness (μm) of layer) | | |
|---|---|---|---|---|
| | Tool body | Lower layer | | |
| Type | symbol | First layer | Second layer | Third layer |
| Coated tool of the present invention, | 31 | J | — | — | — |
| | 32 | K | — | — | — |
| | 33 | J | — | — | — |
| | 34 | K | TiN-(3) (0.5) | — | — |
| Coated tool of Comparative Example, and | 35 | J | TiN-(3) (0.5) | — | — |
| | 36 | K | TiN-(3) (0.1) | — | — |
| Reference coated tool | 37 | J | TiN-(3) (0.5) | l-TiCN-(2) (3) | — |
| | 38 | K | TiN-(3) (0.3) | l-TiCN-(2) (7) | TiN-(3) (0.7) |
| | 39 | J | — | — | — |
| | 40 | K | — | — | — |

TABLE 18

| Type | | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) | Angle at which peak of frequency distribution of the average crystal grain misorientation is present (degree) | Target layer thickness (μm) | Upper layer (numerical value at the bottom indicates target average layer thickness (μm) of layer) |
|---|---|---|---|---|---|---|---|---|---|---|
| Coated tool of the present invention | 31 | J | G | 0.87 | 0.0001 or less | 50 | 21 | 1° or more and less than 2° | 5 | — |
| | 32 | K | J | 0.65 | 0.0001 or less | 63 | 30 | 1° or more and less than 2° | 2 | — |
| | 33 | J | C | 0.79 | 0.0023 | 52 | 21 | 0° or more and less than 1° | 6 | — |
| | 34 | K | G | 0.85 | 0.0001 or less | 55 | 23 | 1° or more and less than 2° | 1 | — |
| | 35 | J | J | 0.65 | 0.0001 or less | 63 | 29 | 0° or more and less than 1° | 3 | TiN-(3) (0.5) |
| | 36 | K | C | 0.75 | 0.0032 | 51 | 21 | 0° or more and less than 1° | 4 | — |
| | 37 | J | G | 0.82 | 0.0001 or less | 52 | 22 | 1° or more and less than 2° | 7 | — |
| | 38 | K | J | 0.63 | 0.0001 or less | 62 | 30 | 0° or more and less than 1° | 3 | — |
| | 39 | J | C | 0.77 | 0.0046 | 51 | 22 | 0° or more and less than 1° | 8 | — |
| | 40 | K | J | 0.61 | 0.0001 or less | 60 | 28 | 0° or more and less than 1° | 3 | — |

TABLE 19

| Type | | Tool body symbol | TiAlCN film forming process formation symbol (see Tables 4 and 5) | Average content ratio of Al $x_{avg}$ | Average content ratio of C $y_{avg}$ | Area ratio of crystal grain having average crystal grain misorientation equal to or more than 1 degree (%) | Area ratio of crystal grain having average crystal grain misorientation equal to or more than 2 degrees (%) | Angle at which peak of frequency distribution of the average crystal grain misorientation is present (degree) | Target layer thickness (μm) | Upper layer (numerical value at the bottom indicates target average layer thickness (μm) of layer) |
|---|---|---|---|---|---|---|---|---|---|---|
| Coated tool of Comparative Example | 31 | J | G' | 0.85 | 0.0001 or less | 7 | 3 | 0° or more and less than 1° | 5 | — |
| | 32 | K | J' | 0.64 | 0.0001 or less | 7 | 2 | 0° or more and less than 1° | 2 | — |
| | 33 | J | C' | 0.76 | 0.0023 | 2 | 0 | 0° or more and less than 1° | 6 | — |
| | 34 | K | G' | 0.83 | 0.0001 or less | 7 | 5 | 0° or more and less than 1° | 1 | — |
| | 35 | J | J' | 0.65 | 0.0001 or less | 9 | 4 | 0° or more and less than 1° | 3 | TiN-(3) (0.5) |
| | 36 | K | C' | 0.72 | 0.0030 | 3 | 0 | 0° or more and less than 1° | 4 | — |
| | 37 | J | G' | 0.81 | 0.0001 or less | 8 | 5 | 0° or more and less than 1° | 7 | — |
| | 38 | K | J' | 0.61 | 0.0001 or less | 9 | 4 | 0° or more and less than 1° | 3 | — |
| Reference coated tool | 39 | J | AIP | 0.52 | 0.0001 or less | 2 | 0 | 0° or more and less than 1° | 8 | — |
| | 40 | K | AIP | 0.59 | 0.0001 or less | 3 | 0 | 0° or more and less than 1° | 3 | — |

(Note)
"AIP" indicates a film forming through arc ion plating.

Next, in a state in which each of the various coated tools was screwed to a tip end portion of an insert holder made of tool steel by a fixing tool, the coated tool of the present inventions 31 to 40, the coated tool of Comparative Examples 31 to 38, and the reference coated tools 39 and 40 were subjected to a dry high-speed intermittent cutting test for carburized alloy steel, which is described below, and the flank wear width of a cutting edge was measured.

Tool body: cubic boron nitride-based ultra-high pressure sintered material
Cutting test: dry high-speed intermittent cutting test for carburized alloy steel
Work material: a round bar of JIS SCr420 (hardness HRC62) with four longitudinal grooves formed with equal intervals in the longitudinal direction
Cutting speed: 235 m/min
Depth of cut: 0.15 mm
Feed rate: 0.1 mm/rev
Cutting time: 4 minutes
The results of the cutting test are shown in Table 20.

TABLE 20

| Type | | Flank wear width (mm) | Type | | Cutting test results (min) |
|---|---|---|---|---|---|
| Coated tool of the present invention | 31 | 0.10 | Coated tool of Comparative Example | 31 | 2.2* |
| | 32 | 0.07 | | 32 | 2.2* |
| | 33 | 0.10 | | 33 | 1.7* |
| | 34 | 0.08 | | 34 | 1.9* |
| | 35 | 0.10 | | 35 | 2.2* |
| | 36 | 0.09 | | 36 | 2.4* |
| | 37 | 0.08 | | 37 | 1.9* |
| | 38 | 0.07 | | 38 | 2.3* |
| | 39 | 0.11 | Reference coated tool | 39 | 2.2* |
| | 40 | 0.11 | | 40 | 1.5* |

Mark * in boxes of coated tool of Comparative Examples and reference coated tools indicates a cutting time (min) until the end of a service life caused by the occurrence of chipping.

From the results shown in Tables 9, 15, and 20, regarding the coated tools of the invention, in the cubic crystal grains of the layer of complex nitride or complex carbonitride of Ti and Al, stress in the in-plane direction parallel to the surface of the tool body of the crystal grain is exhibited due to the presence of the predetermined average crystal grain misorientation. As a result, the hard coating layer maintains high wear resistance, toughness is improved, and excellent chipping resistance and fracture resistance are exhibited, even in a case of being used for high-speed intermittent cutting during which high-temperature heat is generated and intermittent and impact loads are exerted on a cutting edge, resulting in exhibiting excellent wear resistance during long-term use.

Contrary to this, it is apparent that, regarding the coated tool of Comparative Examples and the reference coated tools in which the predetermined average crystal grain misorientation is not present, in the cubic crystal grains configuring the layer of complex nitride or complex carbonitride of Ti and Al, in a case of being used for high-speed intermittent cutting during which high-temperature heat is generated and intermittent and impact loads are exerted on a cutting edge, resulting in the end of the service life within a short period of time, due to occurrence of chipping, fracture, and the like.

INDUSTRIAL APPLICABILITY

As described above, the coated tool of the present invention can be used as a coated tool for various work materials as well as for high-speed intermittent cutting of alloy steel and further exhibits excellent chipping resistance and wear resistance during long-term use, thereby sufficiently satisfying an improvement in performance of a cutting device, power saving and energy saving during cutting, and a further reduction in costs.

REFERENCE SIGNS LIST

1: Measurement Point (Pixel)
2: Boundary

The invention claimed is:

1. A surface-coated cutting tool comprising: a tool body composed of any one of a tungsten carbide-based cemented carbide, a titanium carbonitride-based cermet and a cubic boron nitride-based ultra-high pressure sintered material; and a hard coating layer provided on a surface of the tool body,
wherein (a) the hard coating layer includes at least a layer of a complex nitride or a complex carbonitride of Ti and Al having an average thickness of 1-20 μm, and in a case where the layer of the complex nitride or the complex carbonitride is expressed by a composition formula: $(Ti_{1-x}Al_x)(C_yN_{1-y})$, $x_{avg}$ and $y_{avg}$ satisfy $0.60 \leq x_{avg} \leq 0.95$ and $0 \leq y_{avg} \leq 0.005$, respectively, where $x_{avg}$ is an average content ratio of Al in a total amount of Ti and Al in an atomic ratio, and $y_{avg}$ is an average content ratio of C in a total amount of C and N in an atomic ratio,
(b) the layer of the complex nitride or the complex carbonitride includes at least crystal grains of a complex nitride or a complex carbonitride of Ti and Al having a NaCl type face-centered cubic structure, and
(c) when a polished surface of the layer of the complex nitride or the complex carbonitride is analyzed from a direction perpendicular to the surface using an electron beam backward scattering diffraction device to obtain an average inner-grain misorientation of each of the crystal grains having the NaCl type face-centered cubic structure, as well as a frequency distribution of the average inner-grain misorientation and an area ratio occupied by the crystal grains having the average inner-grain misorientaion of 1 degree or more, the area ratio is 50% or more in the layer of the complex nitride or the complex carbonitride, and a peak exists in a range of: 0 degree or more and less than 1 degree; or 1 degree or more and less than 2 degrees, of the average inner-grain misorientation in the frequency distribution.

2. The surface-coated cutting tool according to claim 1, wherein, when a polished surface as a surface of the layer of the complex nitride or the complex carbonitride is analyzed from a direction perpendicular to the surface using an electron beam backward scattering diffraction device to obtain an average inner-grain misorientation of each of the crystal grains having the NaCl type face-centered cubic structure, an area ratio occupied by the crystal grains having the average inner-grain misorientaion of 2 degrees or more is 30% or more in the layer of the complex nitride or the complex carbonitride.

3. The surface-coated cutting tool according to claim 1, wherein, when a polished surface of the layer of the complex nitride or the complex carbonitride is analyzed from a direction perpendicular to the surface using an electron beam backward scattering diffraction device to measure an average inner-grain misorientation of each of the crystal grains having the NaCl type face-centered cubic structure and to obtain the frequency distribution and the area ratio, a peak exists in a range of 1 degree or more and less than 2 degrees of the average inner-grain misorientation in the frequency distribution.

4. The surface-coated cutting tool according to claim 1, further comprising a lower layer between the tool body and the layer of the complex nitride or the complex carbonitride of Ti and Al, wherein the lower layer includes a Ti compound layer consisted of one or more of: a Ti carbide layer; Ti nitride layer; Ti carbonitride layer; Ti oxycarbide layer; and Ti oxicarbonitride layer, the Ti compound layer having an average total thickness of 0.1-20 μm.

5. The surface-coated cutting tool according to claim 1, further comprising an upper layer above the layer of the complex nitride or the complex carbonitride, wherein the upper layer includes at least an aluminum oxide layer, the upper layer having an average total thickness of 1-25 μm.

* * * * *